(12) United States Patent
Ning et al.

(10) Patent No.: US 10,305,060 B2
(45) Date of Patent: May 28, 2019

(54) ORGANIC LIGHT EMITTING DIODE HAVING A CARBON NANOTUBE COMPOSITE STRUCTURE AS AN ELECTRON TRANSPORT LAYER

(71) Applicants: Tsinghua University, Beijing (CN); HON HAI PRECISION INDUSTRY CO., LTD., New Taipei (TW)

(72) Inventors: Wen Ning, Beijing (CN); Peng Liu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/848,315

(22) Filed: Dec. 20, 2017

(65) Prior Publication Data
US 2019/0067619 A1    Feb. 28, 2019

(30) Foreign Application Priority Data
Aug. 30, 2017    (CN) .......................... 2017 1 0764568

(51) Int. Cl.
*H01L 51/50* (2006.01)
*H01L 51/00* (2006.01)

(52) U.S. Cl.
CPC ...... *H01L 51/5072* (2013.01); *H01L 51/0035* (2013.01); *H01L 51/003* (2013.01); *H01L 51/0012* (2013.01); *H01L 51/0048* (2013.01)

(58) Field of Classification Search
CPC ..................... H01L 51/5072; H01L 51/0048
See application file for complete search history.

(56) References Cited

U.S. PATENT DOCUMENTS 8,969,856 B2 * 3/2015 Liu ...................... H01L 51/0067
257/40
2016/0329515 A1 * 11/2016 Fleissner ............. H01L 51/5265

* cited by examiner

*Primary Examiner* — Quoc D Hoang
(74) *Attorney, Agent, or Firm* — ScienBiziP, P.C.

(57) ABSTRACT

An organic light emitting diode includes a support body, an anode electrode, a hole transport layer, an organic light emitting layer and an electron transport layer stacked on each other in that order. The electron transport layer has a first surface and a second surface opposite to the first surface. The electron transport layer includes a polymer and a plurality of first carbon nanotubes dispersed in the polymer, and partial surface of the plurality of first carbon nanotubes is exposed from the first surface and spaced apart from the organic light emitting layer.

18 Claims, 24 Drawing Sheets

ORGANIC LIGHT EMITTING DIODE HAVING A CARBON NANOTUBE COMPOSITE STRUCTURE AS AN ELECTRON TRANSPORT LAYER

CROSS-REFERENCE TO RELATED APPLICATIONS

This application claims all benefits accruing under 35 U.S.C. § 119 from China Patent Application No. 201710764568.4, filed on Aug. 30, 2017, in the China Intellectual Property Office. This application is related to commonly-assigned application entitled, "METHOD FOR MAKING ORGANIC LIGHT EMITTING DIODE", concurrently filed (Ser. No. 15/848,403); "ORGANIC LIGHT EMITTING DIODE", concurrently filed (Ser. No. 15/841,889); "ORGANIC LIGHT EMITTING DIODE", concurrently filed (Ser. No. 15/848,334); "METHOD FOR MAKING ORGANIC LIGHT EMITTING DIODE", concurrently filed (Ser. No. 15/848,362); "METHOD FOR MAKING ORGANIC LIGHT EMITTING DIODE", concurrently filed (Ser. No. 15/851,896); "METHOD FOR MAKING ORGANIC LIGHT EMITTING DIODE", concurrently filed (Ser. No. 15/851,924). Disclosures of the above-identified applications are incorporated herein by reference.

FIELD

The present application relates to organic light emitting diodes and methods for making the same.

BACKGROUND

The organic light emitting diode (OLED) is a light emitting diode including a light emitting layer composed of an organic compound. The OLED has a light weight, thin thickness, multi-color, and low manufacturing cost. Thus, the OLED has been widely used in various fields.

The carbon nanotube composite structure formed by carbon nanotubes and polymer can be used as the electron transport layer of the OLED. The carbon nanotube composite structure can be formed by two methods. One method includes dispersing the carbon nanotubes into an organic solvent to form a carbon nanotube dispersion, mixing the carbon nanotube dispersion and a monomer solution, and polymerizing the monomer. However, the carbon nanotubes have poor dispersion in the organic solvent, which affects the uniformity of the carbon nanotubes in the composite structure. Another method include completely melting the polymer, and mixing the melted polymer and the carbon nanotubes. However, the carbon nanotubes have poor dispersion in the melted polymer because the melted polymer has greater viscosity. Thus, the uniformity of the carbon nanotubes in the composite structure is still poor. When the carbon nanotube composite structure is used as the electron transport layer of the OLED, the electron transport layer has poor ability to transmit electrons.

What is needed, therefore, is to provide an organic light emitting diode and a method for making the same that can overcome the above-described shortcomings.

BRIEF DESCRIPTION OF THE DRAWINGS

Implementations of the present technology will now be described, by way of example only, with reference to the attached figures, wherein.

DETAILED DESCRIPTION

Figure 1:
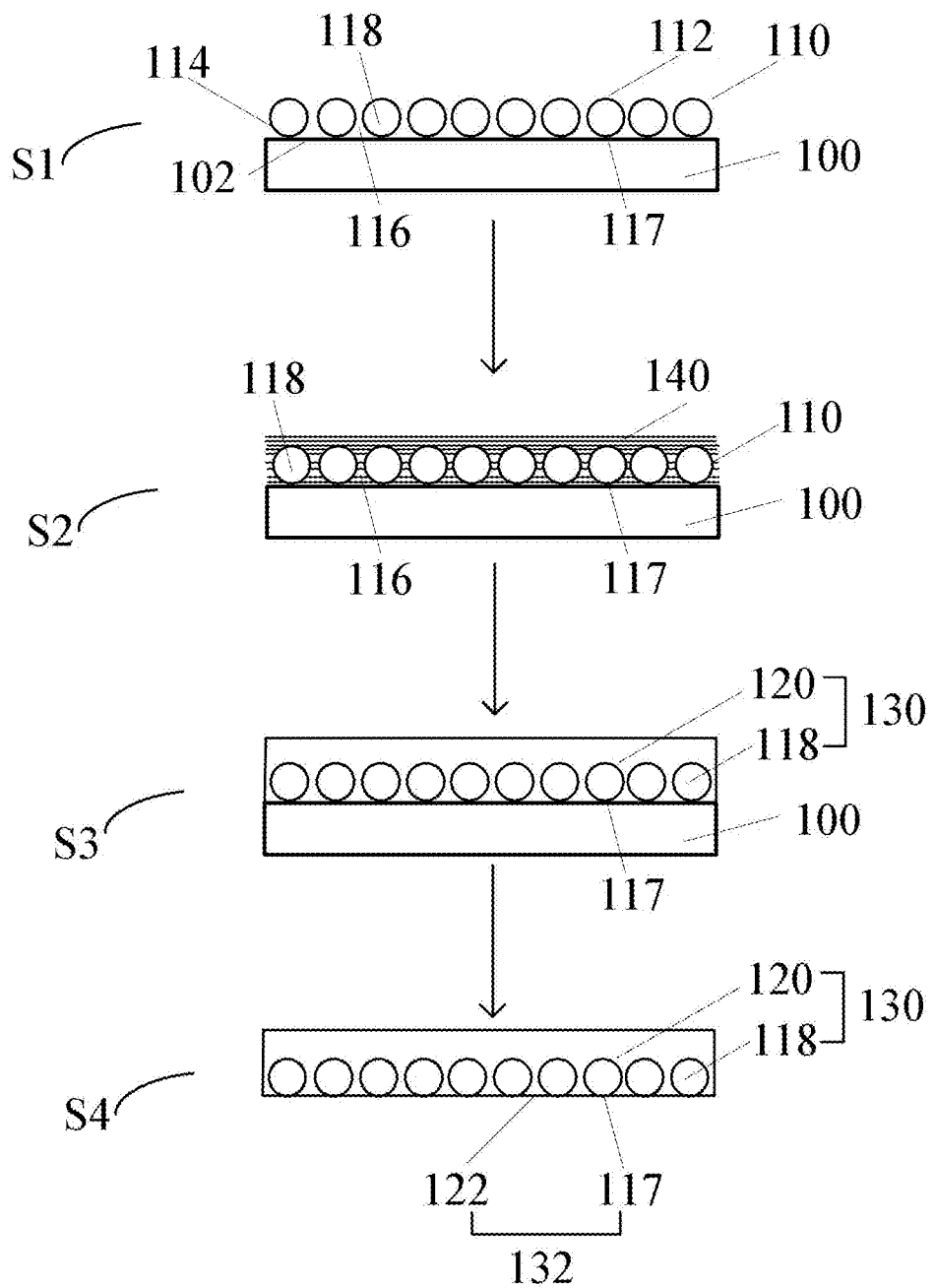
FIG. 1 is a schematic process flow of a first embodiment of a method for making a carbon nanotube composite structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Referring to FIG. 1, a method for making a carbon nanotube composite structure 130 of a first embodiment includes the following steps:

S1, placing a carbon nanotube structure 110 on a substrate surface 102 of a substrate 100, wherein the carbon nanotube structure 110 has a first surface 112 and a second surface 114 opposite to the first surface 112, and the second surface 114 is in direct contact with the substrate surface 102;

S2, coating a monomer solution 140 on the carbon nanotube structure 110, wherein the monomer solution 140 is formed by dispersing a certain amount of monomers into an organic solvent;

S3, polymerizing the monomer; and

S4, removing the substrate 100.

In the step S1, the carbon nanotube structure 110 includes a plurality of carbon nanotubes 118 uniformly distributed therein. A gap 116 is defined between adjacent carbon nanotubes 118. The plurality of carbon nanotubes 118 is parallel to the first surface 112 and the second surface 114. The plurality of carbon nanotubes 118 is parallel to the substrate surface 102. The plurality of carbon nanotubes 118 can be combined by van der Waals attractive force. The carbon nanotube structure 110 can be a substantially pure structure of the carbon nanotubes 118, with few impurities. The plurality of carbon nanotubes 118 may be single-walled, double-walled, multi-walled carbon nanotubes, or their combinations. The carbon nanotubes 118 which are single-walled have a diameter of about 0.5 nanometers (nm) to about 50 nm. The carbon nanotubes 118 which are double-walled have a diameter of about 1.0 nm to about 50 nm. The carbon nanotubes 118 which are multi-walled have a diameter of about 1.5 nm to about 50 nm.

The plurality of carbon nanotubes 118 in the carbon nanotube structure 110 can be orderly or disorderly arranged. The term 'disordered carbon nanotube 118' refers to the carbon nanotube structure 110 where the carbon nanotubes 118 are arranged along many different directions, and the aligning directions of the carbon nanotubes 118 are random. The number of the carbon nanotubes 118 arranged along each different direction can be almost the same (e.g. uniformly disordered). The carbon nanotubes 118 can be entangled with each other. The term 'ordered carbon nanotube 118' refers to the carbon nanotube structure 110 where the carbon nanotubes 118 are arranged in a consistently systematic manner, e.g., the carbon nanotubes 118 are arranged approximately along a same direction and/or have two or more sections within each of which the carbon nanotubes 118 are arranged approximately along a same direction (different sections can have different directions). The carbon nanotube structure 110 can be a carbon nanotube layer structure including a plurality of drawn carbon nanotube films, a plurality of flocculated carbon nanotube films, or a plurality of pressed carbon nanotube films.

Figure 2:
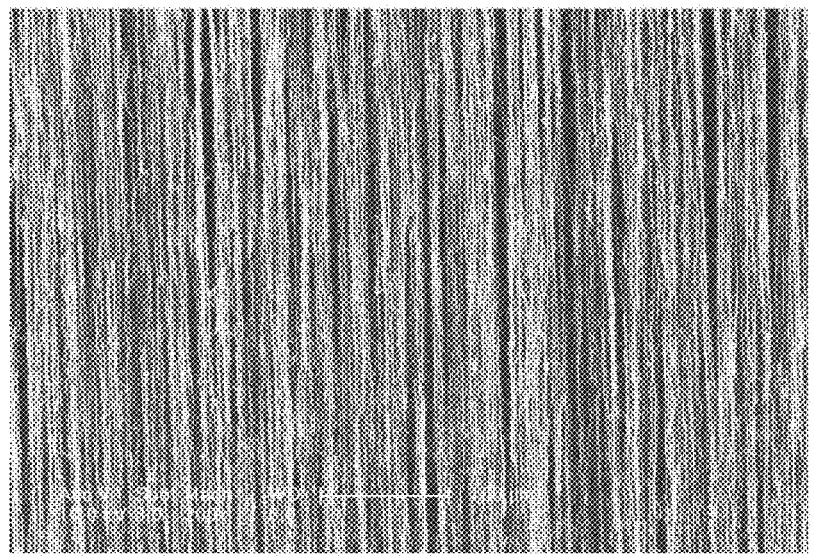
FIG. 2 is a scanning electron microscope (SEM) image of a drawn carbon nanotube film.

Referring to FIG. 2, the drawn carbon nanotube film includes a plurality of successive and oriented carbon nanotubes 118 joined end-to-end by van der Waals attractive force therebetween. The carbon nanotubes 118 in the drawn carbon nanotube film substantially extend along the same direction. The carbon nanotubes are parallel to a surface of the drawn carbon nanotube film. The drawn carbon nanotube film is a free-standing film. The drawn carbon nanotube film can bend to desired shapes without breaking. A film can be drawn from a carbon nanotube array to form the drawn carbon nanotube film.

If the carbon nanotube structure 110 includes at least two stacked drawn carbon nanotube films, adjacent drawn carbon nanotube films can be combined by only the van der Waals attractive force therebetween. Additionally, when the carbon nanotubes 118 in the drawn carbon nanotube film are aligned along one preferred orientation, an angle can exist between the orientations of carbon nanotubes 118 in adjacent drawn carbon nanotube films, whether stacked or adjacent. An angle between the aligned directions of the carbon nanotubes 118 in two adjacent drawn carbon nanotube films can be in a range from about 0 degree to about 90 degrees. Stacking the drawn carbon nanotube films will improve the mechanical strength of the carbon nanotube structure 110, further improving the mechanical strength of the carbon nanotube composite structure 130. In one embodiment, the carbon nanotube structure 110 includes two layers of the drawn carbon nanotube films, and the angle between the aligned directions of the carbon nanotubes 118 in two adjacent drawn carbon nanotube films is about 90 degrees.

Figure 3:
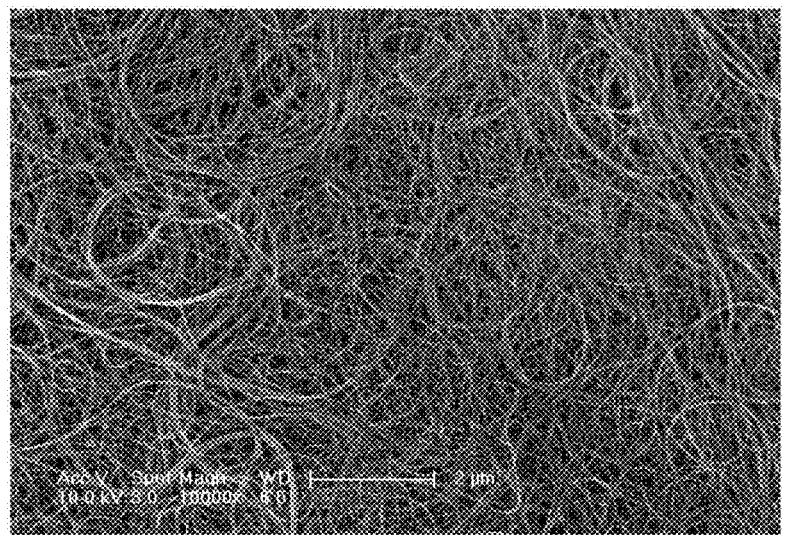
FIG. 3 is an SEM image of a flocculated carbon nanotube film.

Referring to FIG. 3, the flocculated carbon nanotube film includes a plurality of long, curved, disordered carbon nanotubes 118 entangled with each other. The flocculated carbon nanotube film can be isotropic. The carbon nanotubes 118 can be substantially uniformly dispersed in the flocculated carbon nanotube film. Adjacent carbon nanotubes 118 are acted upon by van der Waals attractive force to obtain an entangled structure. Due to the carbon nanotubes 118 in the flocculated carbon nanotube film being entangled with each other, the flocculated carbon nanotube film has excellent durability, and can be fashioned into desired shapes with a low risk to the integrity of the flocculated carbon nanotube film. Further, the flocculated carbon nanotube film is a free-standing film.

Figure 4:
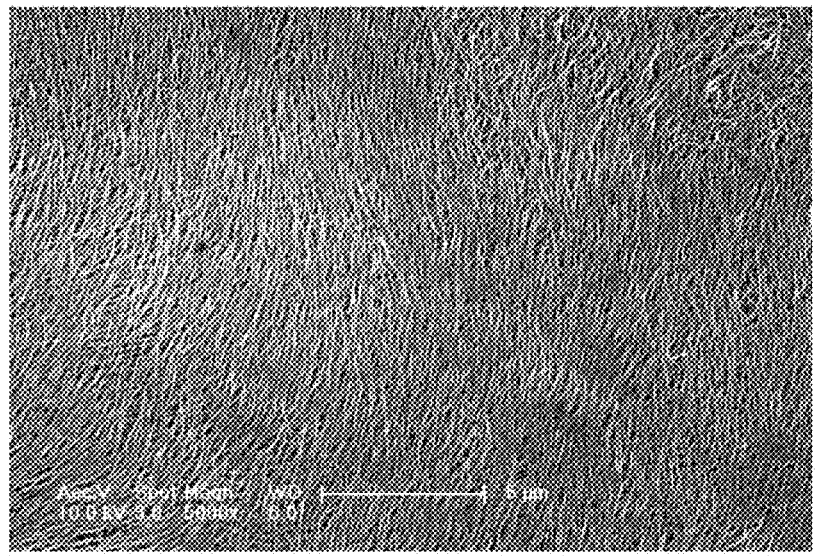
FIG. 4 is an SEM image of a pressed carbon nanotube film including a plurality of carbon nanotubes arranged along the same direction.
Figure 5:
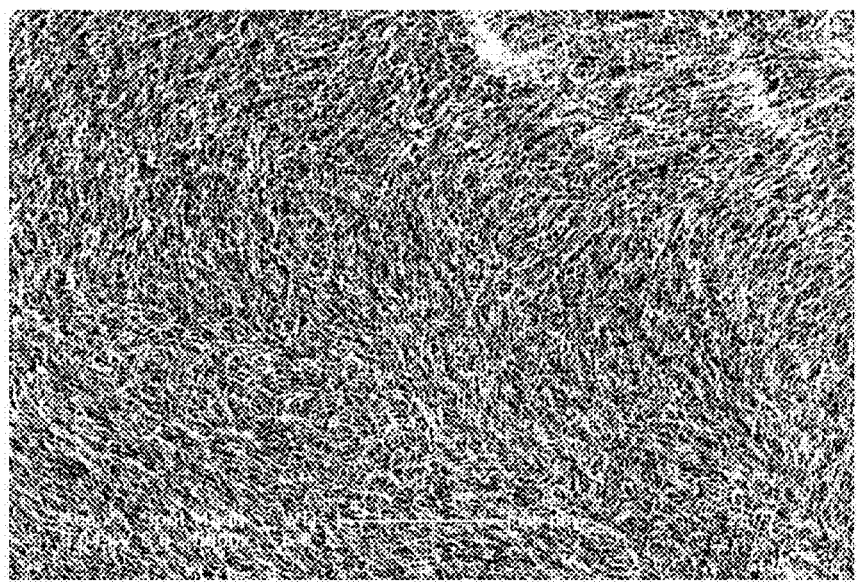
FIG. 5 is an SEM image of a pressed carbon nanotube film including a plurality of carbon nanotubes which is arranged along different directions.

Referring to FIGS. 4 and 5, the pressed carbon nanotube film includes a plurality of carbon nanotubes 118. The carbon nanotubes 118 in the pressed carbon nanotube film can be arranged along a same direction, as shown in FIG. 4. The carbon nanotubes 118 in the pressed carbon nanotube film can be arranged along different directions, as shown in FIG. 5. The carbon nanotubes 118 in the pressed carbon nanotube film can rest upon each other. An angle between a primary alignment direction of the carbon nanotubes 118 and a surface of the pressed carbon nanotube film is about 0 degree to approximately 15 degrees. The greater the pressure applied, the smaller the angle obtained. If the carbon nanotubes 118 in the pressed carbon nanotube film are arranged along different directions, the pressed carbon nanotube film can have properties that are identical in all directions substantially parallel to the surface of the pressed carbon nanotube film. Adjacent carbon nanotubes 118 are attracted to each other and are joined by van der Waals attractive force. Therefore, the pressed carbon nanotube film is easy to bend to desired shapes without breaking. Further, the pressed carbon nanotube film is a free-standing film.

The term "free-standing" includes, but not limited to, the drawn carbon nanotube film, the flocculated carbon nanotube film, or the pressed carbon nanotube film that does not have to be supported by a substrate. For example, the free-standing the drawn carbon nanotube film, the flocculated carbon nanotube film, or the pressed carbon nanotube film can sustain the weight of itself when it is hoisted by a portion thereof without any significant damage to its structural integrity. So, if the free-standing the drawn carbon nanotube film, the flocculated carbon nanotube film, or the pressed carbon nanotube film is placed between two separate supporters, a portion of the free-standing the drawn carbon nanotube film, the flocculated carbon nanotube film, or the pressed carbon nanotube film, not in contact with the two supporters, would be suspended between the two supporters and yet maintain film structural integrity.

The substrate surface 102 of the substrate 100 is very smooth. The height difference between the highest position of the substrate surface 102 and the lowest position of the substrate surface 102 is nanoscale. The height difference between the highest position of the substrate surface 102 and the lowest position of the substrate surface 102 can be defines as a smoothness of the substrate surface 102. The smoothness can be greater than or equal to 0 nanometers and less than or equal to 30 nanometers. The smoothness can be greater than or equal to 0 nanometers and less than or equal to 20 nanometers. The smoothness can also be greater than or equal to 0 nanometers and less than or equal to 10 nanometers. The material of the substrate 100 can be sapphire, monocrystalline quartz, gallium nitride, gallium arsenide, silicon, graphene, or polymer. The melting point of the substrate 100 should be greater than the temperature of polymerizing the monomer. The length, width, and thickness of the substrate 100 are not limited. In one embodiment, the substrate 100 is a silicon wafer.

Some organic solvent can be dripped on the first surface 112 of the carbon nanotube structure 110. When the organic solvent is volatilized, the air between the carbon nanotube structure 110 and the substrate surface 102 can be removed under the surface tension of the organic solvent. Thus, the carbon nanotube structure 110 can be tightly bonded to the substrate surface 102 of the substrate 100. The organic solvent can be ethanol, methanol, acetone, dichloroethane, or chloroform.

In the step S2, the monomer can be any monomer that can be polymerized to form a polymer 120. The polymer 120 includes a phenolic resin (PF), an epoxy resin (EP), a polyurethane (PU), a polystyrene (PS), a polymethylmethacrylate (PMMA), a polycarbonate (PC), polyethylene terephthalate (PET), phenylcyclobutene (BCB), polycycloolefin or polyimide (PI), polyvinylidene fluoride (PVDF), and the like. In one embodiment, the monomer is an imide, and the polymer 120 is a polyimide. The organic solvent includes ethanol, methanol, acetone, dichloroethane or chloroform.

The monomer solution 140 has a small viscosity and good fluidity. When the monomer solution 140 is coated on the first surface 112 of the substrate 100, the monomer solution 140 can pass through the gaps 116 and contact with a part of the substrate surface 102. The first part of the substrate surface 102 is in direct contact with and coated by the monomer solution 140, the second part of the substrate surface 102 is in direct contact with the carbon nanotubes 118. The method for coating the monomer solution 140 is not limited and can be spin coating, injection coating, or the like. In one embodiment, the monomer solution 140 is coated on the carbon nanotube structure 110 by spin coating.

In the step S3, the method for polymerizing the monomer is not limited, such as high temperature treatment. In one embodiment, the substrate 100 and the carbon nanotube structure 110 coated with the monomer solution 140 are placed in a reaction furnace. The reaction furnace is heated to the temperature of polymerizing the monomer, and the monomer is polymerized to form the polymer 120. The part surface of the carbon nanotube 118, that is directly contacted with the substrate surface 102 of the substrate 100, is defined as a contact surface 117. Because the carbon nanotubes 118 are tubular, the second surface 114 of the carbon nanotube structure 110 is in fact a ups and downs surface. The contact surface 117 is parts of the second surface 114. Except for the contact surface 117, the rest of second surface 114 is in direct contact with the monomer solution 140. The gaps 116 are filled with the monomer solution 140. When the monomer is polymerized to form the solid polymer 120, the polymer 120 is combined with the carbon nanotube structure 110 to form the carbon nanotube composite structure 130.

In the step S4, the method for removing the carbon nanotube composite structure 130 from the substrate surface 102 of the substrate 100 is not limited. The carbon nanotube composite structure 130 can be peeled off from the substrate surface 102 of the substrate 100 by water immersion, blade, tape, or other tools.

The smoothness of the substrate surface 102 is nanoscale, thus the contact surface 117 can be in direct contact with the substrate surface 102 during coating the monomer solution 140 and polymerizing the monomer. Thus, there is no monomer solution 140 between the contact surface 117 and the substrate surface 102 during coating the monomer solution 140 and polymerizing the monomer. Thus, when the carbon nanotube composite structure 130 is peeled from the substrate surface 102, the contact surface 117 is exposed and not coated by the polymer 120. A part outer wall of the carbon nanotubes 118, that is directly contacted with the substrate surface 102, is exposed and not coated by the polymer 120. Except for the contact surface 117, the rest of the outer walls of carbon nanotubes 118 are coated by and in direct contact with the polymer 120.

The carbon nanotube composite structure 130 includes the plurality of carbon nanotubes 118 and the polymer 120. The plurality of carbon nanotubes 118 are uniformly dispersed in the polymer 120. The plurality of carbon nanotubes 118 can be joined end-to-end and extend along the same direction. The plurality of carbon nanotubes 118 can also extend along different directions, or entangled with each other to form a network-like structure. The carbon nanotube composite structure 130 has a first composite structure surface 132. The first composite structure surface 132 is in direct contact with the substrate surface 102 before peeling the carbon nanotube composite structure 130 off from the substrate 100. The length direction of the plurality of carbon nanotubes 118 is parallel to the first composite structure surface 132. The surface of the polymer 120 near the substrate 100 is defined as a lower surface 122. The contact surface 117 and the lower surface 122 together form the first composite structure surface 132. Thus, the contact surface 117 is a part of the first composite structure surface 132 and exposed from the polymer 120. The contact surface 117 is an exposed surface and can protrude out of the lower surface 122 of the polymer 120. The height difference between the exposed surface and the lower surface 122 of the polymer 120 is nanoscale. Since the smoothness of the substrate surface 102 is at nanoscale level, the first composite structure surface 132 is also smooth at nanoscale level. The height difference between the contact surface 117 and the lower surface 122 can be greater than or equal to 0 nanometers and less than or equal to 30 nanometers. The height difference between the contact surface 117 and the lower surface 122 can be greater than or equal to 0 nanometers and less than or equal to 20 nanometers. The height difference between the contact surface 117 and the lower surface 122 can also be greater than or equal to 0 nanometers and less than or equal to 10 nanometers.

In one embodiment, the polymer 120 is polyimide, the carbon nanotube structure 110 is two stacked drawn carbon nanotube films, and the angle between the aligned directions of the carbon nanotubes 118 in two adjacent drawn carbon nanotube films is about 90 degrees.

In one embodiment, to synthesize poly(amic acid) (PAA) solution, 2.0024 g of ODA (10 mmol) was placed in a three-neck flask containing 30.68 mL of anhydrous DMAc under nitrogen purge at room temperature. After ODA is completed dissolved in DMAc, 2.1812 g of PMDA (10 mmol) is added in one portion. Thus, the solid content of the solution is about 12%. The mixture is stirred at room temperature under nitrogen purge for 12 h to produce a PAA solution. The two stacked drawn carbon nanotube films are located on a silicon wafer, wherein the angle between the aligned directions of the carbon nanotubes 118 in two adjacent drawn carbon nanotube films is about 90 degrees. Then the PAA solution is coated on the two stacked drawn carbon nanotube films, and the PAA solution will gradually penetrate into the two stacked drawn carbon nanotube films to form a preform. The preform is thermal imidized in muffle furnace at 80° C., 120° C., 180° C., 300° C., and 350° C. for 1 h respectively to form a CNT/PI composite structure. Finally, the CNT/PI composite structure is peeled off from the silicon wafer.

Figure 6:
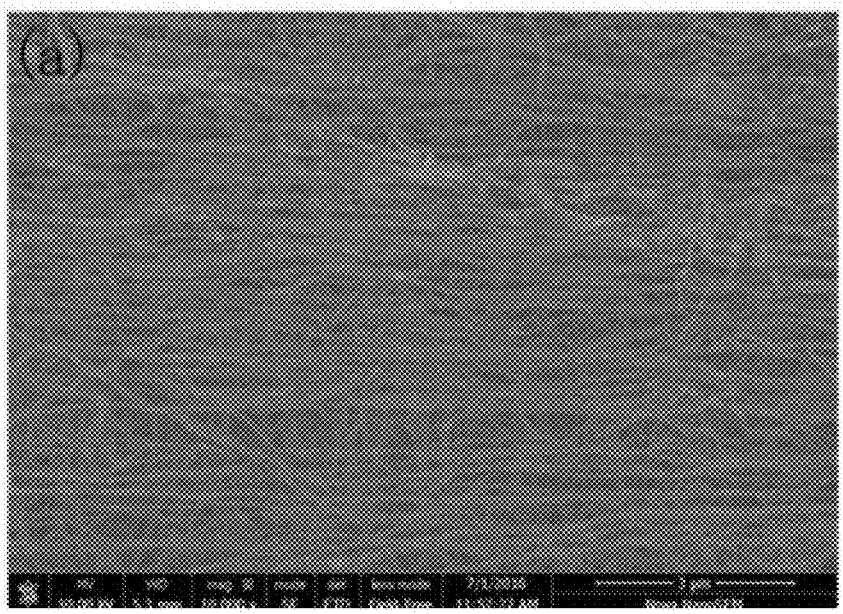
FIG. 6 is an SEM image of a first composite structure surface of a CNT/PI composite structure.

FIG. 6 is an SEM image of the first composite structure surface of a CNT/PI composite structure. As shown in FIG. 6, the carbon nanotubes 118 are uniformly dispersed in the CNT/PI composite structure.

Figure 7:
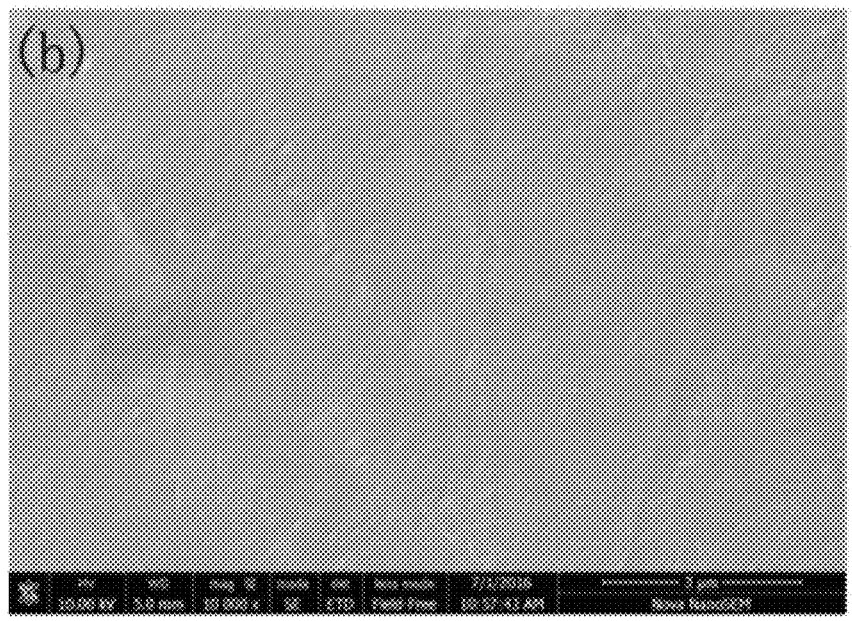
FIG. 7 is an SEM image of the first composite structure surface of the CNT/PI composite structure coated with a gold film.
Figure 8:
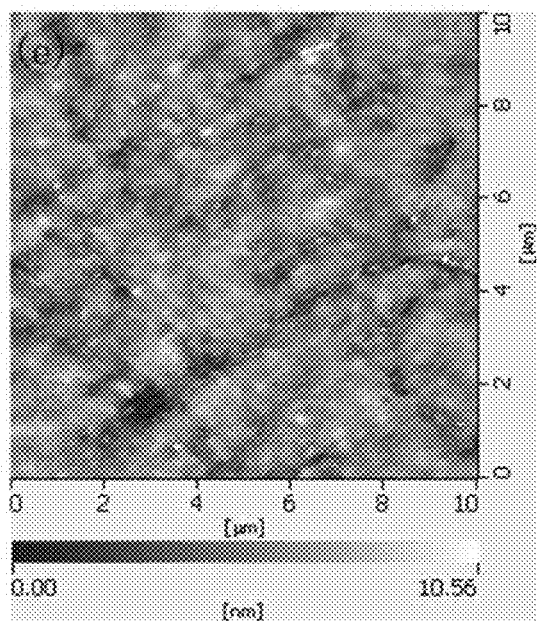
FIG. 8 is an atomic force microscope (AFM) image of the first composite structure surface of the CNT/PI composite structure.
Figure 9:
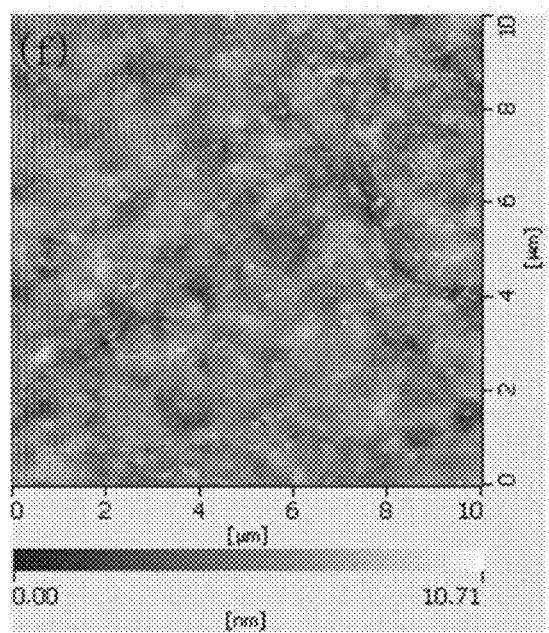
FIG. 9 is an AFM image of the first composite structure surface of the CNT/PI composite structure coated with a gold film.

FIG. 7 is an SEM image of the first composite structure surface of the CNT/PI composite structure coated with a gold film, and the thickness of the gold film is about 1 nm. As shown in FIG. 7, the first composite structure surface 132 is a smooth surface with no ups and downs from the naked eye. The height difference between the highest place of the first composite structure surface 132 and the lowest place of the first composite structure surface 132 is nanoscale. FIG. 8 is an atomic force microscope (AFM) image of the first composite structure surface of the CNT/PI composite structure. FIG. 9 is an AFM image of the first composite structure surface of the CNT/PI composite structure coated with a gold film, and the thickness of the gold film is about 3 nm. As shown in FIG. 8 and FIG. 9, it is also find that the first composite structure surface 132 is a smooth surface.

Figure 10:
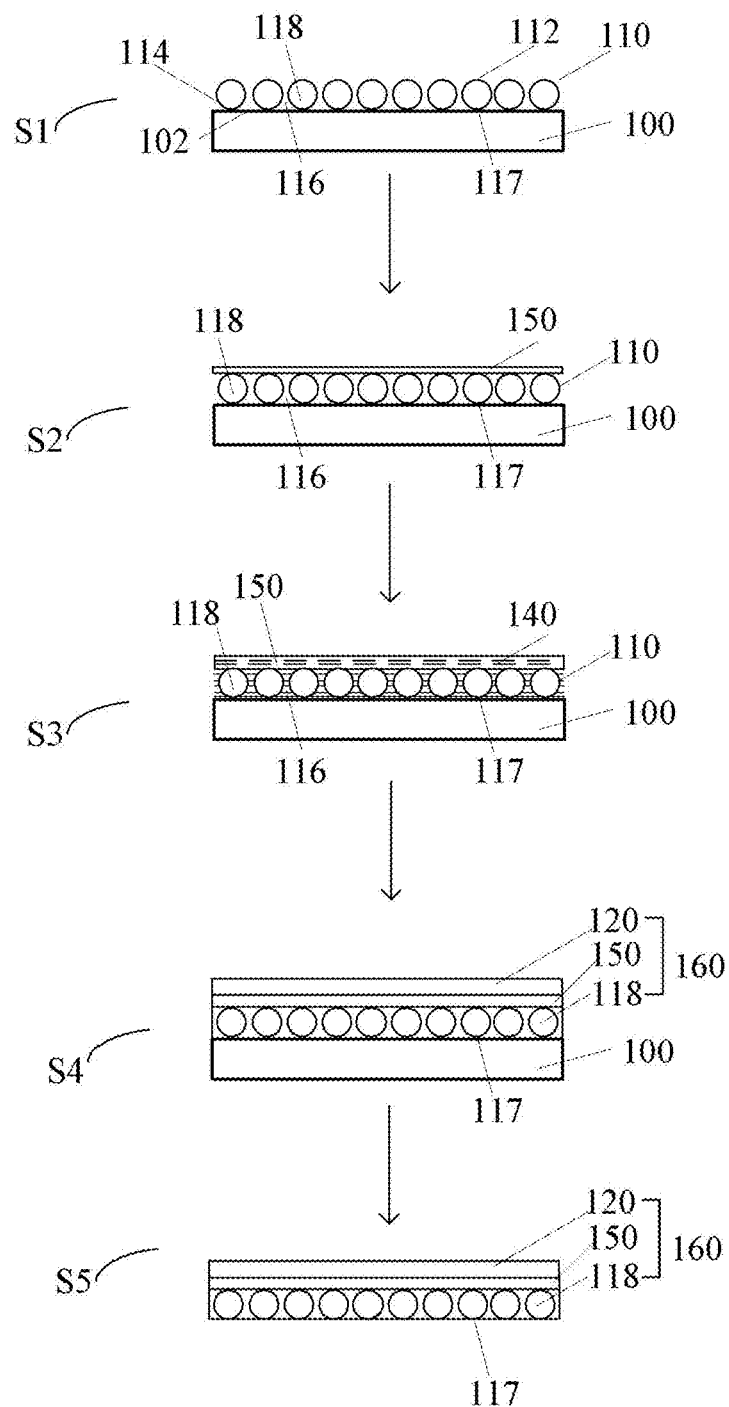
FIG. 10 is a schematic process flow of a second embodiment of a method for making a carbon nanotube composite structure.

Referring to FIG. 10, a method for making a carbon nanotube composite structure 160 of a second embodiment includes the following steps:

S21, placing the carbon nanotube structure 110 on the substrate surface 102 of the substrate 100, wherein the carbon nanotube structure 110 has the first surface 112 and the second surface 114 opposite to the first surface 112, and the second surface 114 is in direct contact with the substrate surface 102;

S22, locating a graphene layer 150 on the first surface 112;

S23, coating a monomer solution 140 on the graphene layer 150 and the carbon nanotube structure 110, wherein the monomer solution 140 is formed by dispersing the monomer into the organic solvent;

S24, polymerizing the monomer; and

S25, removing the substrate 100.

In this embodiment, the method for making the carbon nanotube composite structure 160 is similar to the method for making the carbon nanotube composite structure 130 above except that the graphene layer 150 is located on the first surface 112 before coating the monomer solution 140.

The graphene layer 150 is a two dimensional film structure. If the graphene layer 150 includes a plurality of graphene films, the plurality of graphene films can overlap each other to form a large area. The graphene film is a one-atom thick planar sheet composed of a plurality of $sp^2$-bonded carbon atoms. The graphene layer 150 can be a free-standing structure. The term "free-standing structure" means that the graphene layer 150 can sustain the weight of itself when it is hoisted by a portion thereof without any significant damage to its structural integrity. So, if the graphene layer 150 is placed between two separate supports, a portion of the graphene layer 150 not in contact with the two supports, would be suspended between the two supports and yet maintain structural integrity. When the plurality of graphene films overlap each other, a gap is formed between adjacent two graphene films. During coating the monomer solution 140, the monomer solution 140 can pass through the graphene layer 150 and the carbon nanotube structure 110 to arrive at the substrate surface 102, because both the graphene layer 150 and the carbon nanotube structure 110 have gaps 106.

Figure 11:
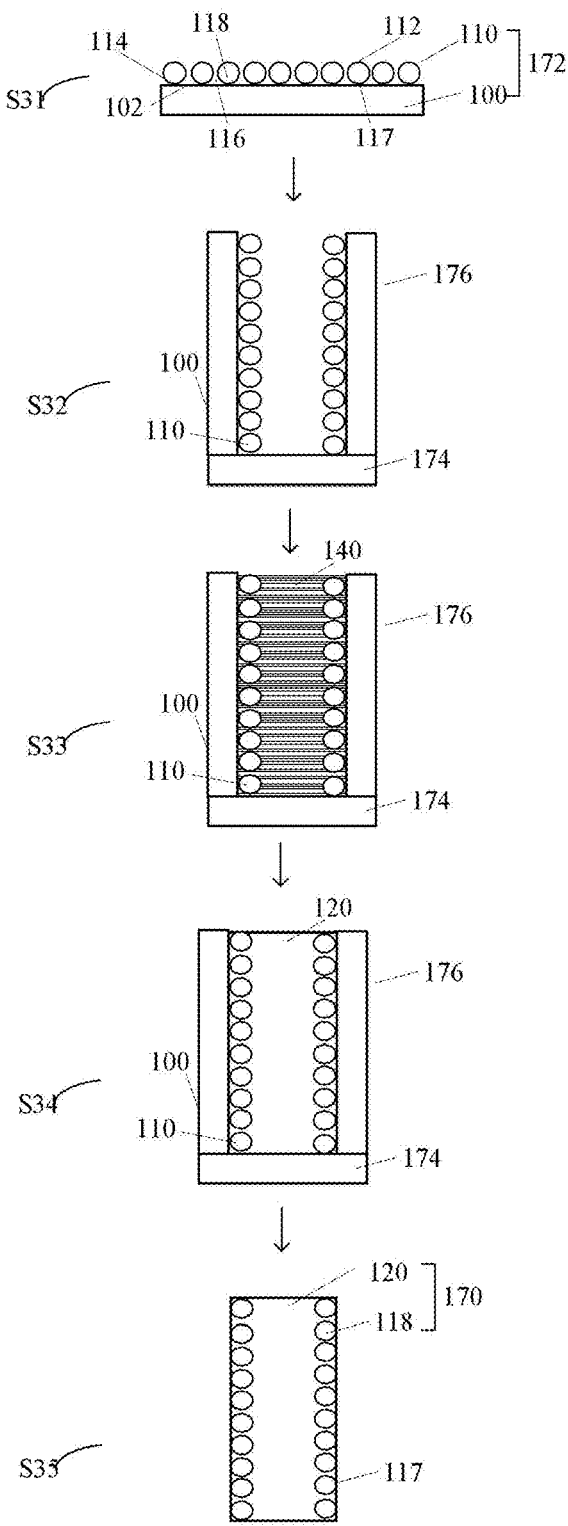
FIG. 11 is a schematic process flow of a third embodiment of a method for making a carbon nanotube composite structure.

Referring to FIG. 11, a method for making a carbon nanotube composite structure 170 of a third embodiment includes the following steps:

S31, placing the carbon nanotube structure 110 on the substrate surface 102 of the substrate 100 to form a preform structure 172, wherein the carbon nanotube structure 110 has the first surface 112 and the second surface 114 opposite to the first surface 112, and the second surface 114 is in direct contact with the substrate surface 102;

S32, locating two preform structures 172 on a base 174, wherein the two preform structures 172 are spaced apart from each other, the substrates 100 of the two preform structures 172 and the base 174 form a mold 176 having an opening, and the carbon nanotube structures 110 of the two preform structures 172 are opposite to each other and inside of the mold 176;

S33, injecting the monomer solution 140 into the inside of the mold 176 from the opening of the mold 176, wherein the monomer solution 140 is formed by dispersing the monomer into the organic solvent;

S34, polymerizing the monomer; and

S35, removing the substrates 100 and the base 174.

In this embodiment, the method for making the carbon nanotube composite structure 170 is similar to the method for making the carbon nanotube composite structure 130 above except the steps S32 and S33.

In the step S32, the method for making the mold 176 is not limited. For example, the two preforms structures 172 and the base 174 are fixed together by sticking or mechanically fastening to form the mold 176. In one embodiment, the two preforms structures 172 and the base 174 are fixed by a sealant, and the sealant is 706B vulcanized silicon rubber. The opening is on the top of the mold 176. The carbon nanotube structure 110 of each of the two preforms structures 172 is located inside of the mold 176. The substrate 100 of each of the two preforms structures 172 forms the sidewall of the mold 176. The material of the base 174 is not limited, such as glass, silica, metal or metal oxide. In one embodiment, the material of the substrate 174 is glass. The carbon nanotube structure 110 in the mold 176 would not fall off from the substrate 100 because the carbon nanotube structure 110 itself has viscosity. The organic solvent can be dripped so that the carbon nanotube structure 110 is firmly adhered to the substrate 100.

Furthermore, the length or width of the carbon nanotube structure 110 can be greater than the length or width of the substrate surface 102. When the carbon nanotube structure 110 is disposed on the substrate surface 102, the excess carbon nanotube structure 110 can be folded into the back surface of the substrate 100, and an adhesive can be applied to the back surface of the substrate 100. Thus, the carbon nanotube structure 110 in the mold 176 is firmly adhered to the substrate 100 and would not fall off from the substrate 100. The back surface is opposite to the substrate surface 102, and the substrate surface 102 can be considered the front surface. The melting point of the adhesive needs to be greater than the temperature of polymerizing the monomer.

In the step S33, the monomer solution 140 is slowly injected into the inside of the mold 176 along the inner wall of the mold 176. The monomer solution 140 completely submerges the carbon nanotube structure 110. The monomer solution 140 would not break the integrity of the carbon nanotube structure 110 during injecting the monomer solution 140 because the carbon nanotube structure 110 is supported by the substrate 100.

Figure 12:
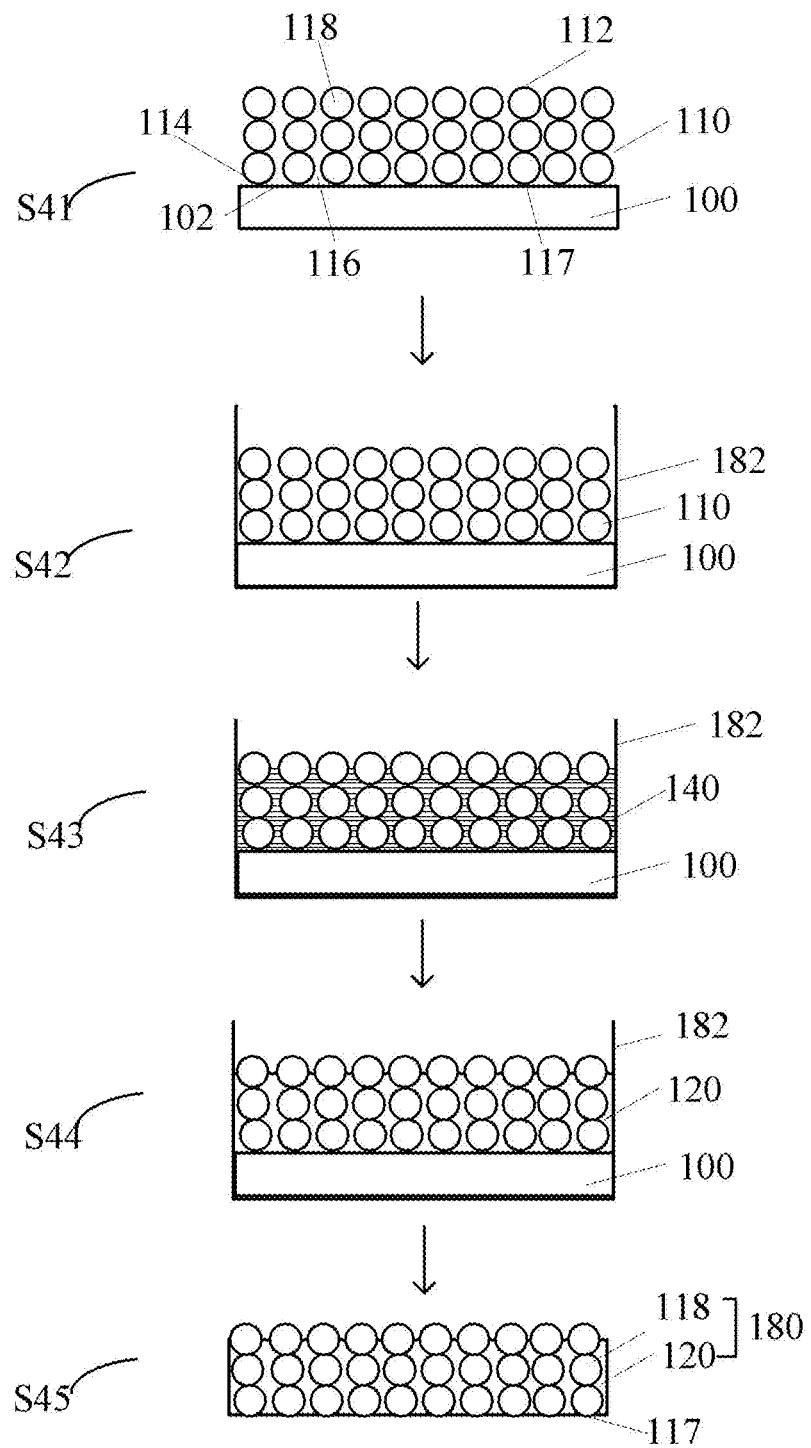
FIG. 12 is a schematic process flow of a fourth embodiment of a method for making a carbon nanotube composite structure.

Referring to FIG. 12, a method for making a carbon nanotube composite structure 180 of a fourth embodiment includes the following steps:

S41, placing the carbon nanotube structure 110 on the substrate surface 102 of the substrate 100, wherein the carbon nanotube structure 110 has the first surface 112 and the second surface 114 opposite to the first surface 112, and the second surface 114 is in direct contact with the substrate surface 102;

S42, placing the carbon nanotube structure 110 and the substrate 100 into a container 182, wherein the container 182 has an opening;

S43, injecting the monomer solution 140 into the container 182 from the opening of the container 182, wherein the monomer solution 140 is formed by dispersing the monomer into the organic solvent;

S44, polymerizing the monomer; and

S45, removing the substrates 100 and the container 182.

In this embodiment, the method for making the carbon nanotube composite structure 180 is similar to the method for making the carbon nanotube composite structure 130 above except the steps S42 and S43.

In the step S42, the container 182 has a bottom. When the carbon nanotube structure 110 and the substrate 100 are located in the container 182, the substrate 100 is located on and in direct contact with the bottom of the container 182. The carbon nanotube structure 110 spaced apart from the bottom by the substrate 100. The material of the container 182 is not limited, such as silica, metal, glass, or metal oxide. In one embodiment, the material of the container 182 is glass.

In the step S43, the monomer solution 140 does not break the integrity of the carbon nanotube structure 110 during injecting the monomer solution 140 because the carbon nanotube structure 110 is supported by the substrate 100. The amount of the monomer solution 140 can be adjusted so that the monomer solution 140 submerges the entire carbon nanotube structure 110, or submerges only a part of the carbon nanotube structure 110. When the monomer solution 140 submerges only a part of the carbon nanotube structure 110, the thickness of the polymer 120 is less than the thickness of the carbon nanotube structure 110. Thus, in the carbon nanotube composite structure 180, some carbon nanotubes 118 are located in and completely coated by the polymer 120, and some carbon nanotubes 118 are exposed from and extend out of the polymer 120. In one embodiment, the carbon nanotube structure 110 includes three stacked drawn carbon nanotube films, and the monomer solution 140 submerges only a part of the carbon nanotube structure 110. In the carbon nanotube composite structure 180, the first drawn carbon nanotube film, the second drawn carbon nanotube film and the third drawn carbon nanotube film are stacked. The second drawn carbon nanotube film is between the first drawn carbon nanotube film and the third drawn carbon nanotube film. The entire outer walls of the carbon nanotubes 118 in the second drawn carbon nanotube film are coated by the polymer 120. Partial outer wall of the carbon nanotubes 118 in the first drawn carbon nanotube film are exposed. The contact surfaces 117 of the carbon nanotubes 118 in the third drawn carbon nanotube film are exposed.

The monomer solution 140 has a smaller viscosity than the molten polymer, thus after coating the monomer solution 140 and polymerizing the monomer, the carbon nanotubes 118 can uniformly dispersed in the polymer 120. In above methods, the substrate 100 has a nanoscale smooth substrate surface 102, thus some carbon nanotubes of the carbon nanotube composites 130, 160, 170, and 180 are exposed from the polymer 120, improving the conductivity of the carbon nanotube composites 130, 160, 170, and 180.

The carbon nanotube composite structures 130, 170, and 180 can be used as an electron transport layer in an organic light emitting diode (OLED). The OLEDs and the methods for making the OLEDs are described in detail below.

Figure 13:
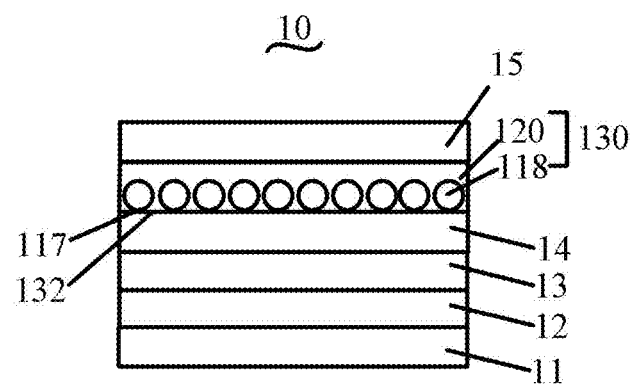
FIG. 13 is a schematic view of a fifth embodiment of an organic light emitting diode.

Referring to FIG. 13, an OLED 10 of a fifth embodiment includes a support body 11, an anode electrode 12, a hole transport layer 13, an organic light emitting layer 14, the carbon nanotube composite structure 130, and a cathode electrode 15. The support body 11, the anode electrode 12, the hole transport layer 13, the organic light emitting layer 14, the carbon nanotube composite structure 130, and the cathode electrode 15 are stacked on each other in that order. The carbon nanotube composite structure 130 includes the plurality of carbon nanotubes 118 and the polymer 120, and the plurality of carbon nanotubes 118 is dispersed in the polymer 120. The contact surface 117 of the plurality of carbon nanotubes 118 is in direct contact with the organic light emitting layer 14. The rest surfaces of the plurality of carbon nanotubes 118 are covered by and in direct contact with the polymer 120. The carbon nanotube composite structure 130 serves as the electrode transport layer for transporting electrons. In the fifth embodiment, the material of the polymer 120 can transport electrons and is an aromatic compound having a large conjugated plane, such as 8-Hydroxyquinoline aluminum salt (AlQ), 2-(4-tert(4-biphenyl)-1,3,4-oxadiazole (PBD), $Beq_2$ or 4,4'-Bis(2,2-diphenylvinyl)-1,1'-biphenyl (DPVBi).

The support body 11 can be transparent or opaque. The material of the support body 11 can be glass, quartz, transparent plastic or resin. In the fifth embodiment, the support body 11 is a glass plate. The anode electrode 12 is a transparent conductive layer or a porous mesh structure, such as ITO layer, FTO layer, or the like. In the fifth embodiment, the material of the anode electrode 12 is ITO.

The hole transport layer 13 has a strong hole transporting ability. The material of the hole transport layer 13 can be N,N'-bis-(1-naphthyl)-N,N'-diphenyl-1,4-diamine (NPB), N,N'-diphenyl-N,N'-bis(m-methylphenyl)-1, Biphenyl-4,4'-diamine (TPD), or 4,4',4''-tris(3-methylphenylaniline)triphenylamine (MTDATA). In the fifth embodiment, the material of the hole transport layer 13 is NPB.

The organic light emitting layer 14 is a polymer or a small molecule organic compound having high quantum efficiency, good semiconductivity, and thermal stability. A molecular weight of the polymer can be in a range from about 10000 to about 100000. The polymer can be a conductive conjugated polymer or a semiconductor conjugated polymer. A molecular weight of the small molecule organic compound can be in a range from about 500 to about 20000. The small molecule organic compound can be an organic dye. The organic dye has characteristics of strong chemical modification, wide selection range, easy purification and high quantum efficiency. The small molecule organic compound can be a red, green, or blue material. When the small molecule organic compound is a red material, the red material can be selected from the group consisting of rhodamine dyes, DCM, DCT, DCJT, DCJTB, DCJTI and TPBD. When the small molecule organic compound is a green material, the green material can be selected from coumarin 6, quinacridone (QA), coronene, naphthalimide. When the small molecule organic compound is a blue material, the blue material can be selected from the group consisting of N-arylbenzimidazoles, and 1,2,4-triazole derivatives (TAZ) and distyrylarylene. In the fifth embodiment, the material of the organic light emitting layer 14 is Alq3. The cathode electrode 15 is a transparent layer, an opaque conductive layer, or a porous mesh structure, such as a metal thin film, a metal mesh, an ITO layer, an FTO layer, and the like. In the fifth embodiment, the cathode electrode 15 is an aluminum layer.

The OLED 10 can further include a hole injection layer (not shown in figure) and an electron injection layer (not shown in figure). The hole injection layer is between the anode electrode 12 and the hole transport layer 13. The electron injection layer is between the carbon nanotube composite structure 130 and the cathode electrode 15. The material of the hole injection layer can be copper phthalocyanine (CuPc) or PEDOT:PSS. The PEDOT is a polymerization of 3,4-ethylenedioxythiophene monomer (EDOT). The PSS is polystyrene sulfonate. The material of the electron injecting layer is an alkali metal or an alkali metal compound having a low work function, such as lithium fluoride (LiF), calcium (Ca), or magnesium (Mg).

The carbon nanotube composite structure 130 can conduct and transport electrons, so the cathode electrode 15 can be omitted. When the cathode electrode 15 is omitted, the carbon nanotube composite structure 130 is used as both the electron transport layer and the cathode electrode. In the OLED 10 as shown in FIG. 13, the plurality of carbon nanotubes 118 substantially extend along the same direction and are uniformly dispersed in the polymer 120, thus the transmitting electrons ability of the electron transport layer is enhanced.

Figure 14:
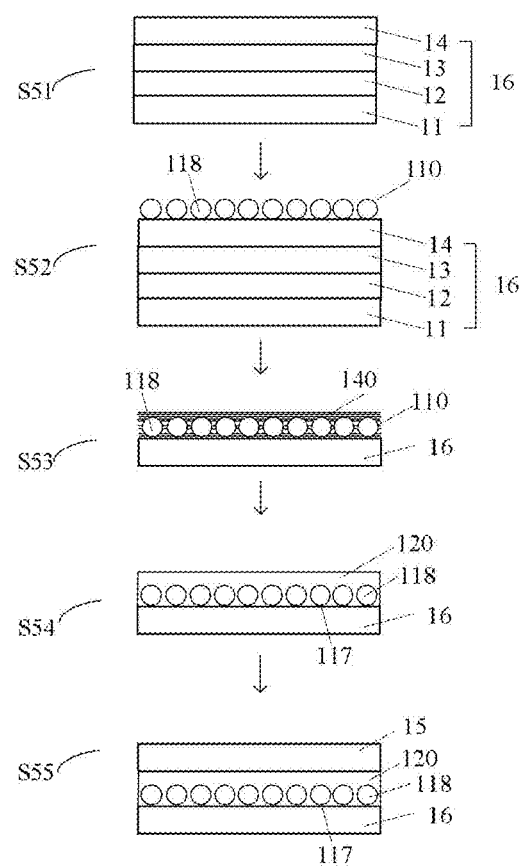
FIG. 14 is a schematic process flow of a method for making the organic light emitting diode of FIG. 13.

Referring to FIG. 14, a method for making the OLED 10 of the fifth embodiment includes the following steps:

S51, providing a preform structure 16 including the support body 11, the anode electrode 12, the hole transport layer 13, and the organic light emitting layer 14, wherein the support body 11, the anode electrode 12, the hole transport layer 13, and the organic light emitting layer 14 are stacked on each other in that order;

S52, placing the carbon nanotube structure 110 on the preform structure 16, wherein the carbon nanotube structure 110 is in direct contact with the surface of the organic light emitting layer 14 away from the hole transport layer 13;

S53, applying the monomer solution 140 to the carbon nanotube structure 110;

S54, polymerizing the monomer to form the polymer 120; and

S55, forming the cathode electrode 15 on the surface of the polymer 120 away from the preform structure 16.

In the step S51, the method for sequentially stacking the support body 11, the anode electrode 12, the hole transport layer 13, and the organic light emitting layer 14 is not limited, such as sputtering, coating, vapor deposition, mask etching, spraying, or inkjet printing. The steps S52 to S54 are similar to the steps S1 to S3 of the first embodiment. In order to ensure that the support body 11, the anode electrode 12, the hole transport layer 13, and the organic light emitting layer 14 would not be damaged by the temperature of polymerizing the monomer, the melting points of the support body 11, the anode electrode 12, the hole transport layer 13, and the organic light emitting layer 14 should be greater than the temperature of polymerizing the monomer. In the step S55, the cathode electrode 15 is formed by a conventional method, such as sputtering, coating, vapor deposition or the like. It is to be understood that the step 55 can be omitted when the cathode electrode 15 is omitted from the OLED 10 and the carbon nanotube composite structure 130 is used as both the electron transport layer and the electrode.

Figure 15:
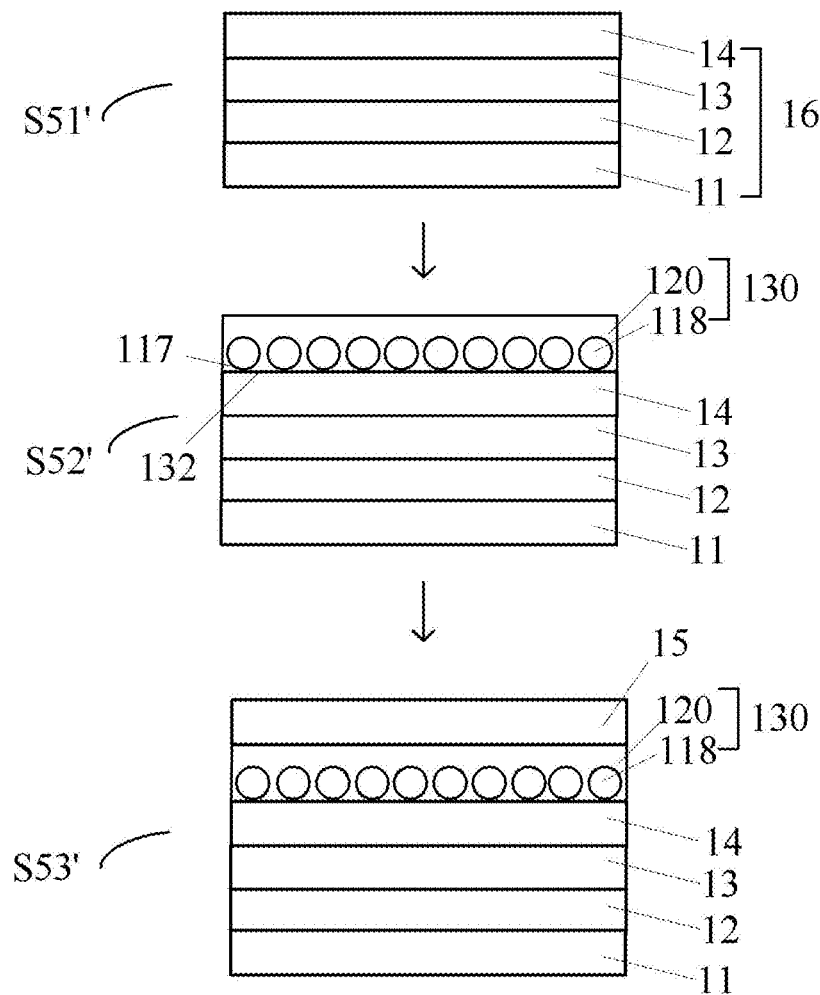
FIG. 15 is another schematic process flow of a method for making the organic light emitting diode of FIG. 13.

Referring to FIG. 15, another method for making the OLED 10 of the fifth embodiment includes the following steps:

S51', providing the preform structure 16 including the support body 11, the anode electrode 12, the hole transport layer 13, and the organic light emitting layer 14, wherein the support body 11, the anode electrode 12, the hole transport layer 13, and the organic light emitting layer 14 are stacked on each other in that order;

S52', placing the carbon nanotube composite structure 130 on the surface of the organic light emitting layer 14 away from the hole transport layer 13, wherein the first composite structure surface 132 of the carbon nanotube composite structure 130 is in direct contact with the organic light emitting layer 14; and S53', forming the cathode electrode 15 on the surface of the carbon nanotube composite structure 130 away from the organic light emitting layer 14.

In this embodiment, the anode electrode 12, the hole transport layer 13, the organic light emitting layer 14, the carbon nanotube composite structure 130, and the cathode electrode 15 are stacked on each other in that order on the support body 11.

In the step S52', in order to make the carbon nanotube composite structure 130 and the organic light emitting layer 14 to be combined firmly, the carbon nanotube composite structure 130 and the organic light emitting layer 14 can be hot pressed or cold pressed before forming the cathode electrode 15. In one embodiment, the carbon nanotube composite structure 130 is placed on the organic light emitting layer 14 to form a whole structure; the whole structure is located in a hot-press apparatus having a metal roll and a heating element. The heated metal roll presses the whole structure, the polymer 120 and the organic light emitting layer 14 are softened, and the air between the organic light emitting layer 14 and the carbon nanotube composite structure 130 is exhausted, so that the organic light emitting layer 14 and the carbon nanotube composite structure 130 are tightly pressed together. During pressing by the metal roll, the pressure from the metal roll is in a range from about 5 kg to about 20 kg. The temperature of the metal roll should not cause the organic light emitting layer 14 and the carbon nanotube composite structure 130 to melt. It is to be understood that the step 53' can be omitted when the cathode electrode 15 is omitted from the OLED 10 and the carbon nanotube composite structure 130 is used as both the electron transport layer and the electrode.

Figure 16:
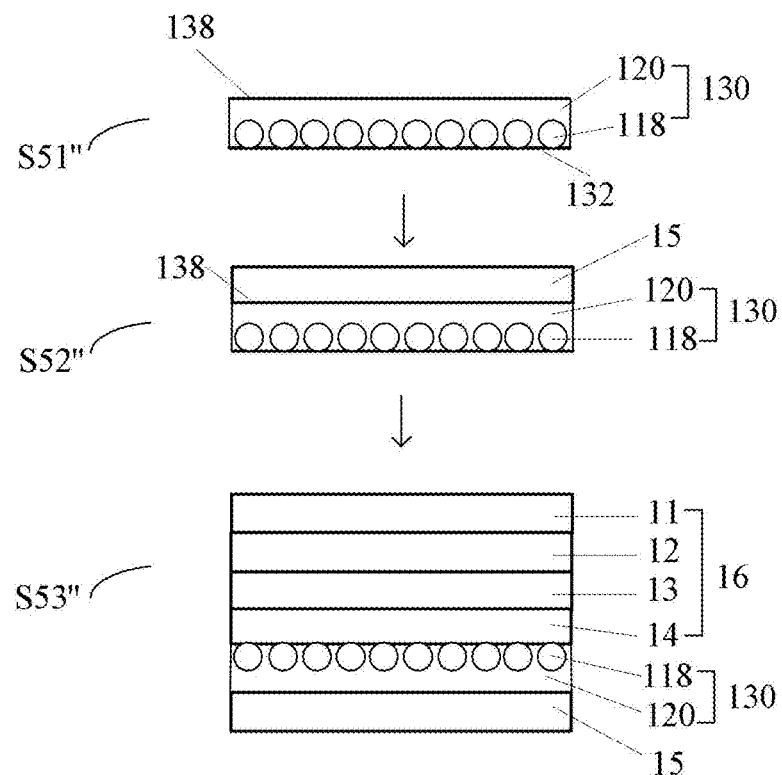
FIG. 16 is yet another schematic process flow of a method for making the organic light emitting diode of FIG. 13.

Referring to FIG. 16, yet another method for making the OLED 10 of the fifth embodiment includes the following steps:

S51", providing the carbon nanotube composite structure 130, wherein the carbon nanotube composite structure 130 has the first composite structure surface 132 and a second composite structure surface 138 opposite to the first composite structure surface 132;

S52", forming the cathode electrode 15 on the second composite structure surface 138, wherein the plurality of carbon nanotubes 118 of the carbon nanotube composite structure 130 is spaced apart from the cathode electrode 15; and S53", forming the preform structure 16 on the first composite structure surface 132, wherein the plurality of carbon nanotubes 118 is in direct contact with the organic light emitting layer 14.

In this embodiment, the method for making the OLED 10 is shown where the cathode electrode 15 is formed on the second composite structure surface 138 of the carbon nanotube composite structure 130, and the preform structure 16 is formed on the first composite structure surface 132 of the carbon nanotube composite structure 130. In this embodiment, firstly, the organic light emitting layer 14 is formed on the first composite structure surface 132, then the hole transport layer 13 is formed on the surface of the organic light emitting layer 14 away from the first composite structure surface 132; secondly, the anode electrode 12 is formed on the surface of the hole transport layer 13 away from the organic light emitting layer 14, then the support body 11 is placed on the surface of the anode electrode 12 away from the hole transport layer 13. The method for forming the anode electrode 12, the hole transport layer 13, or the organic light emitting layer 14 can be sputtering, coating, vapor deposition, mask etching, spraying, or inkjet printing. The step 52" can be omitted when the cathode electrode 15 is omitted from the OLED 10 and the carbon nanotube composite structure 130 is used as both the electron transport layer and the electrode. The carbon nanotube composite structure 130 is a free-standing structure and can support other elements in the OLED 10, thus support body 11 of the preform structure 16 can be omitted.

Figure 17:
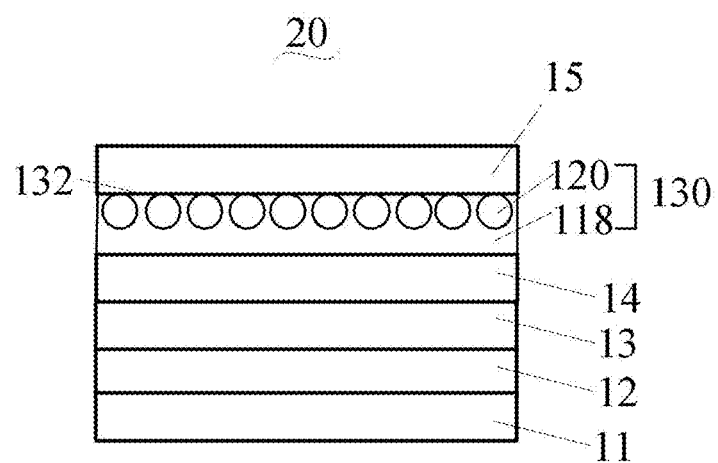
FIG. 17 is a schematic view of a sixth embodiment of an organic light emitting diode.

Referring to FIG. 17, an OLED 20 of a sixth embodiment is shown. The OLED 20 is similar to the OLED 10 above except that the first composite structure surface 132 is in direct contact with the organic light emitting layer 14 in the OLED 10, and the first composite structure surface 132 is spaced apart from the organic light emitting layer 14 in the OLED 20.

Figure 18:
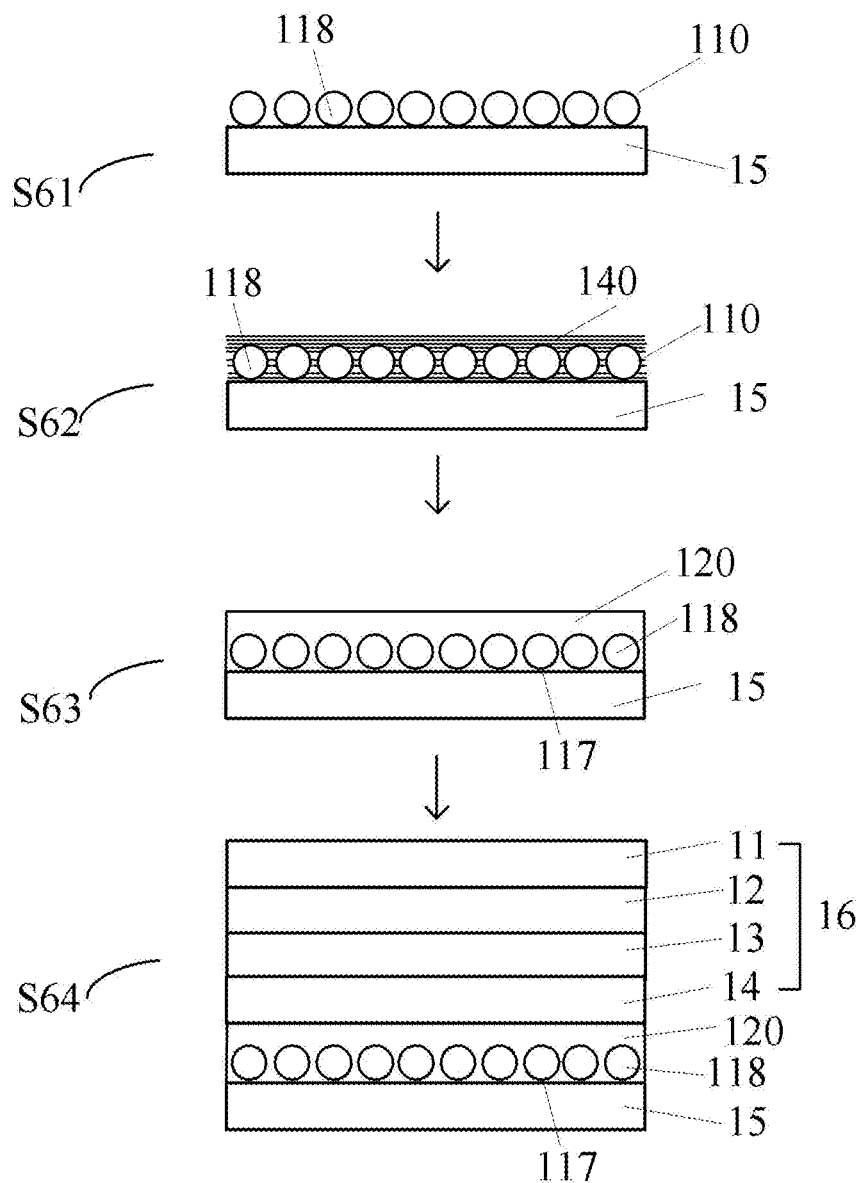
FIG. 18 is a schematic process flow of a method for making the organic light emitting diode of FIG. 17.

Referring to FIG. 18, a method for making the OLED 20 of the sixth embodiment includes the following steps:

S61, placing the carbon nanotube structure 110 on the cathode electrode 15;

S62, applying the monomer solution 140 to the carbon nanotube structure 110;

S63, polymerizing the monomer to form the polymer 120; and

S64, forming the preform structure 16 on the surface of the polymer 120 away from the cathode electrode 15, wherein the polymer 120 is in direct contact with the organic light emitting layer 14, and the carbon nanotube structure 110 is spaced apart from the organic light emitting layer 14.

In order to ensure that the cathode electrode 15 would not be damaged by the temperature of polymerizing the monomer, the melting points of the cathode electrode 15 should be greater than the temperature of polymerizing the monomer. In this embodiment, the steps of applying the monomer solution 140 to the carbon nanotube structure 110 and polymerizing the monomer are similar to the steps S2 and S3 of the first embodiment.

Figure 19:
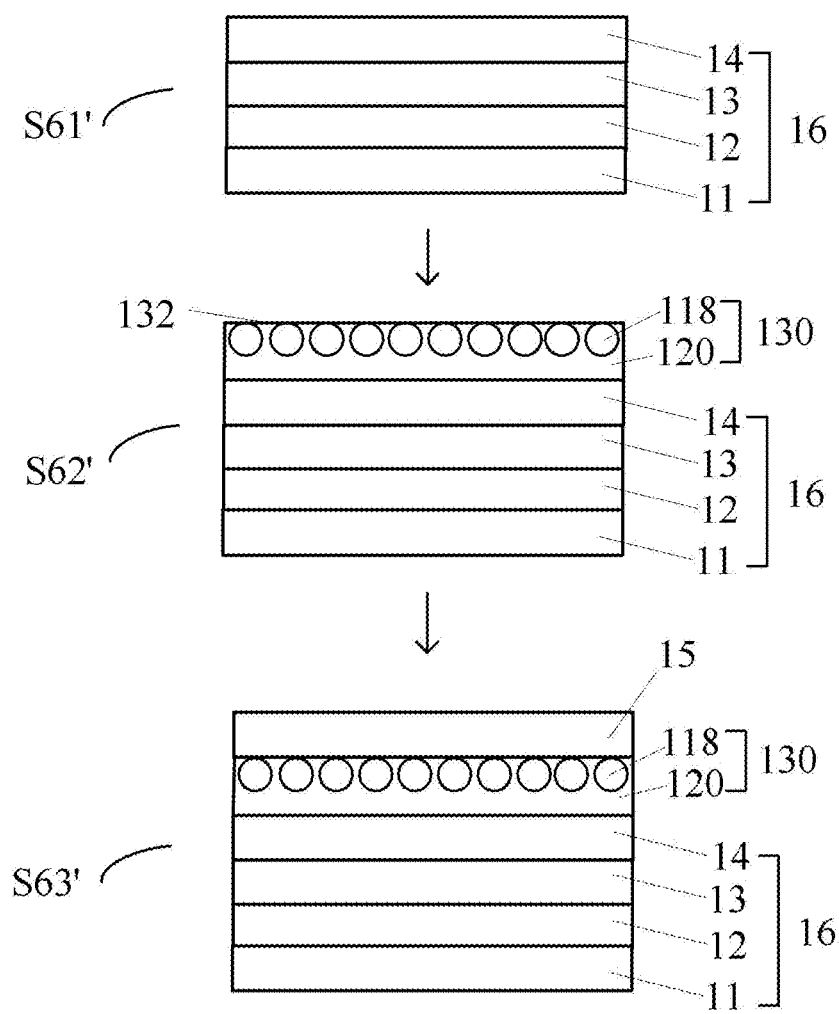
FIG. 19 is another schematic process flow of a method for making the organic light emitting diode of FIG. 17.

Referring to FIG. 19, another method for making the OLED 20 of the sixth embodiment includes the following steps:

S61', providing the preform structure 16 including the support body 11, the anode electrode 12, the hole transport layer 13, and the organic light emitting layer 14, wherein the support body 11, the anode electrode 12, the hole transport layer 13, and the organic light emitting layer 14 are stacked on each other in that order;

S62', placing the carbon nanotube composite structure 130 on the surface of the organic light emitting layer 14 away from the hole transport layer 13, wherein the first composite structure surface 132 of the carbon nanotube composite structure 130 is spaced apart from the organic light emitting layer 14; and S63', forming the cathode electrode 15 on the first composite structure surface 132.

The method as shown in FIG. 19 is similar to the method as shown in FIG. 15 above except that the first composite structure surface 132 is in direct contact with the organic light emitting layer 14 in the method as shown in FIG. 15, and the first composite structure surface 132 is spaced apart from the organic light emitting layer 14 in the method as shown in FIG. 19.

Figure 20:
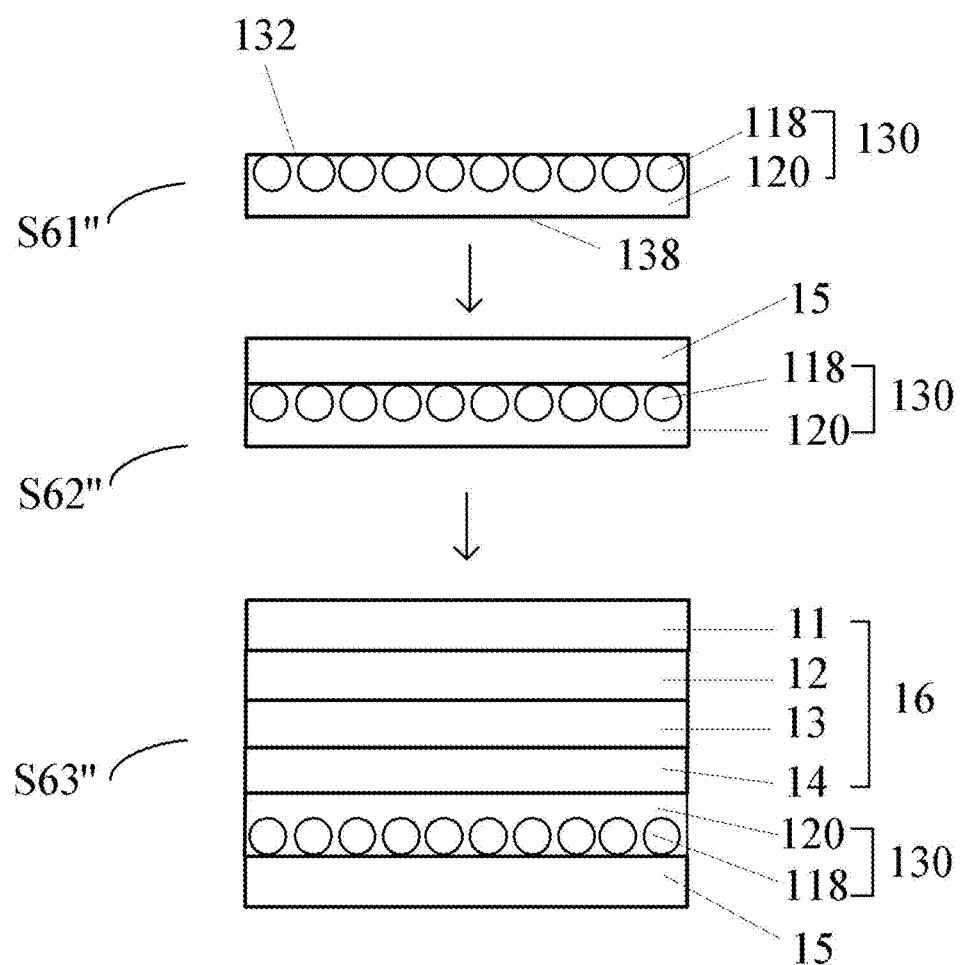
FIG. 20 is yet another schematic process flow of a method for making the organic light emitting diode of FIG. 17.

Referring to FIG. 20, yet another method for making the OLED 20 of the sixth embodiment includes the following steps:

S61", providing the carbon nanotube composite structure 130, wherein the carbon nanotube composite structure 130 has the first composite structure surface 132 and the second composite structure surface 138 opposite to the first composite structure surface 132;

S62", forming the cathode electrode 15 on the first composite structure surface 132, wherein the plurality of carbon nanotubes 118 is in direct contact with the cathode electrode 15; and S63", forming the preform structure 16 on the second composite structure surface 138, wherein organic light emitting layer 14 is in direct contact with the second composite structure surface 138, and the plurality of carbon nanotubes 118 of the carbon nanotube composite structure 130 is spaced apart from the organic light emitting layer 14.

The method as shown in FIG. 20 is similar to the method as shown in FIG. 16 above except that the first composite structure surface 132 is in direct contact with the organic light emitting layer 14 in the method as shown in FIG. 16, and the first composite structure surface 132 is spaced apart from the organic light emitting layer 14 in the method as shown in FIG. 20.

Figure 21:
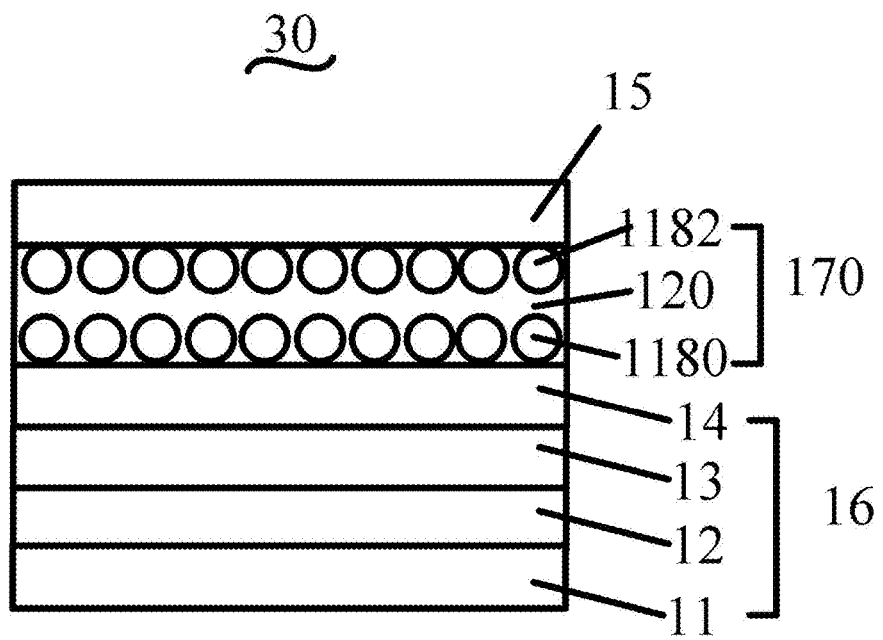
FIG. 21 is a schematic view of a seventh embodiment of an organic light emitting diode.
Figure 22:
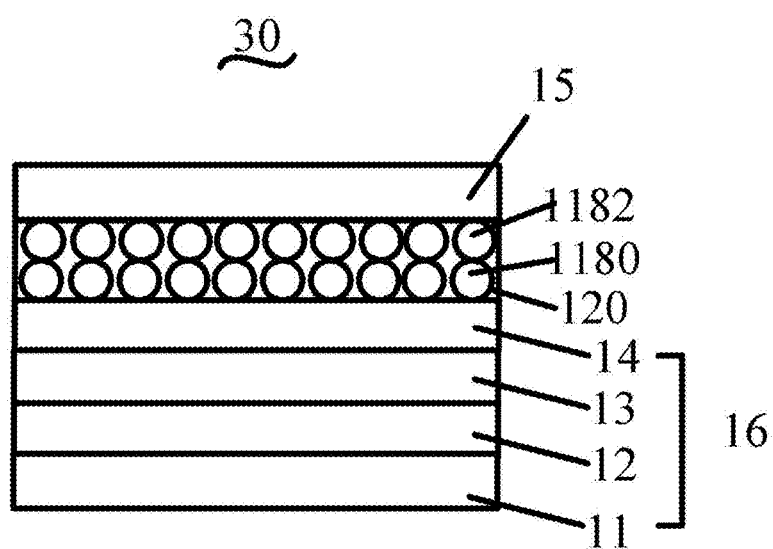
FIG. 22 is another schematic view of the seventh embodiment of the organic light emitting diode.

Referring to FIG. 21, an OLED 30 of a seventh embodiment is shown. The OLED 30 is similar to the OLED 10 above except that the carbon nanotube composite structure 170 is used as the electron transport layer of the OLED 30. The carbon nanotube composite structure 170 includes a plurality of first carbon nanotubes 1180 and a plurality of second carbon nanotubes 1182. The plurality of second carbon nanotubes 1182 and the plurality of first carbon nanotubes 1180 are dispersed in the polymer 120. Partial surface of each first carbon nanotube 1180 is exposed from the polymer 120 and in direct contact with the organic light emitting layer 14. Partial surface of each second carbon nanotube 1182 is exposed from the polymer 120 and in direct contact with the cathode electrode 15. The plurality of second carbon nanotubes 1182 and the plurality of first carbon nanotubes 1180 can be spaced apart from each other, as shown in FIG. 21. The plurality of second carbon nanotubes 1182 and the plurality of first carbon nanotubes 1180 can also be in direct contact with each other, as shown in FIG. 22. When plurality of second carbon nanotubes 1182 and the plurality of first carbon nanotubes 1180 are in direct contact with each other, the material of the polymer 120 is not limited and can be insulated.

Figure 23:
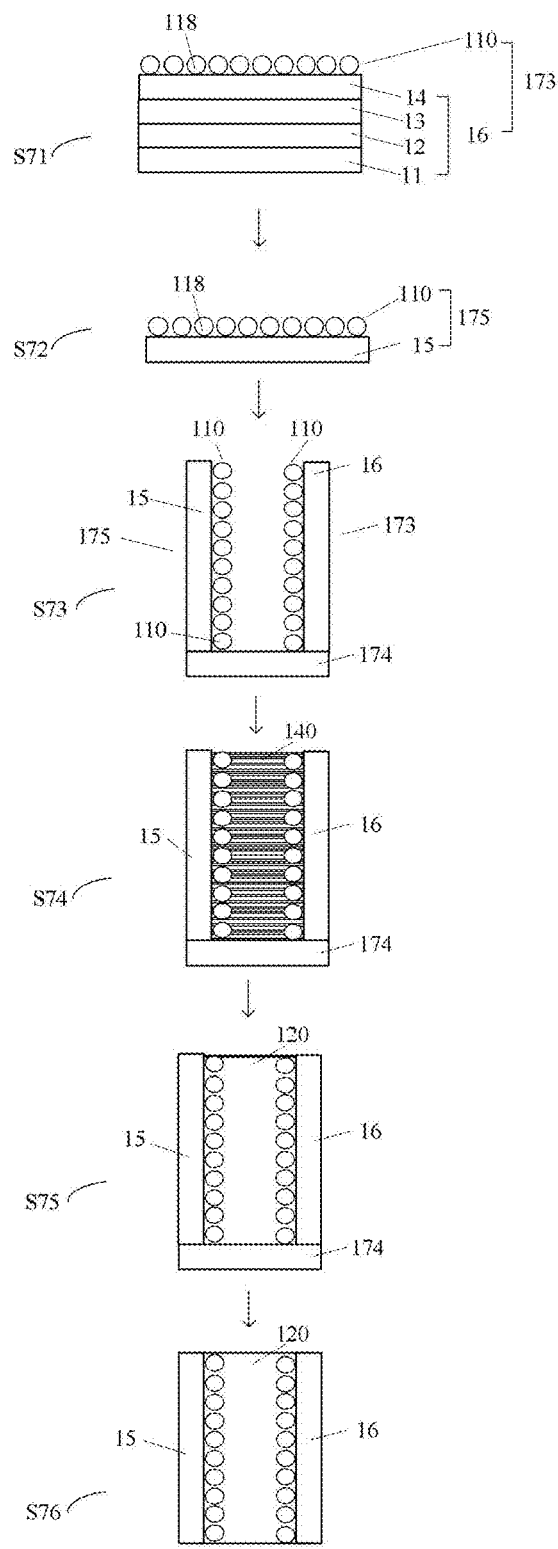
FIG. 23 is a schematic process flow of a method for making the organic light emitting diode of FIG. 21.

Referring to FIG. 23, a method for making the OLED 30 of the seventh embodiment includes the following steps:

S71, placing the carbon nanotube structure 110 on the preform structure 16 to form a first composite structure 173, wherein the carbon nanotube structure 110 is in direct contact with the surface of the organic light emitting layer 14 away from the hole transport layer 13;

S72, placing the other carbon nanotube structure 110 on the cathode electrode 15 to form a second composite structure 175;

S73, locating the first composite structure 173 and the second composite structure 175 on the base 174, wherein the first composite structure 173 and the second composite structure 175 are spaced apart from each other; the base 174, the preform structure 16, and the cathode electrode 15 form a second mold 177 having an opening; and the carbon nanotube structures 110 of the first composite structure 173 and the second composite structure 175 are opposite to each other and inside of the second mold 177;

S74, injecting the monomer solution 140 into the inside of the second mold 177 from the opening, wherein the monomer solution 140 is formed by dispersing the monomer into the organic solvent;

S75, polymerizing the monomer; and

S76, removing the base 174.

The method for making the OLED 30 as shown in FIG. 23 is similar to the method for making the carbon nanotube composite structure 170 as shown in FIG. 11 above except that: 1) in FIG. 11, the carbon nanotube structure 110 is placed on the substrate 100 to form the preform structure 172, the substrates 100 of two preform structures 172 and the base 174 form the mold 176; in FIG. 23, the carbon nanotube structure 110 is placed on the preform structure 16 to form the first composite structure 173, another carbon nanotube structure 110 is placed on the cathode electrode 15 to form the second composite structure 175, and the base 174, the preform structure 16, and the cathode electrode 15 form the second mold 177; 2) in FIG. 11, all of the base 174 and the two substrates 100 are removed; in FIG. 23, only the base 174 is removed.

Figure 24:
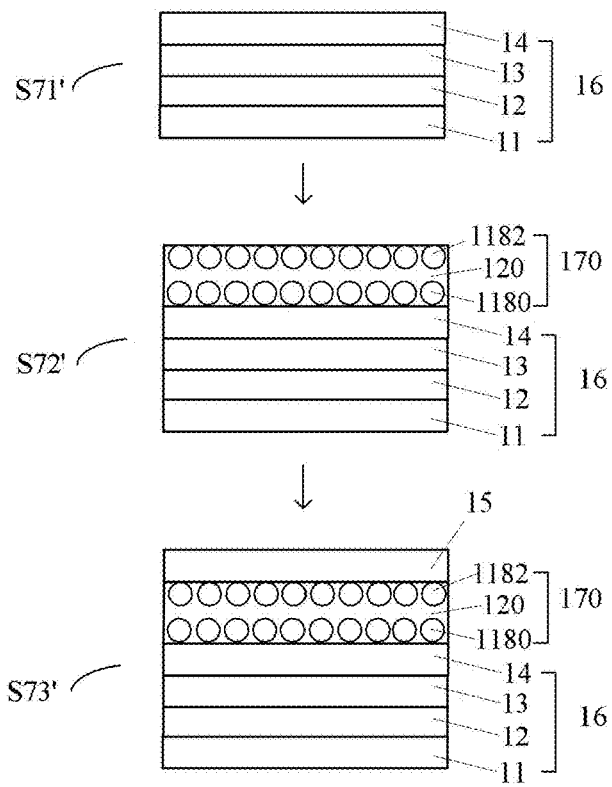
FIG. 24 is another schematic process flow of a method for making the organic light emitting diode of FIG. 21.

Referring to FIG. 24, another method for making the OLED 30 of the seventh embodiment includes the following steps:

S71', providing the preform structure 16 including the support body 11, the anode electrode 12, the hole transport layer 13, and the organic light emitting layer 14, wherein the support body 11, the anode electrode 12, the hole transport layer 13, and the organic light emitting layer 14 are stacked on each other in that order;

S72', placing the carbon nanotube composite structure 170 on the surface of the organic light emitting layer 14 away from the hole transport layer 13, wherein carbon nanotube composite structure 170 includes the plurality of first carbon nanotubes 1180 and the plurality of second carbon nanotubes 1182, the part of the surface of each first carbon nanotube 1180 is exposed from the polymer 120 and in direct contact with the organic light emitting layer 14, and the part of the surface of each second carbon nanotube 1182 is exposed from the polymer 120; and S73', forming the cathode electrode 15 on the surface of the carbon nanotube composite structure 170 away from the organic light emitting layer 14, wherein the part of the surface of each second carbon nanotube 1182 is exposed from the polymer 120 and in direct contact with the cathode electrode 15.

The method as shown in FIG. 24 is similar to the method as shown in FIG. 19 above except that the carbon nanotube composite structure is different in the two methods.

Yet another method for making the OLED 30 of the seventh embodiment includes the following steps:

S71", providing the carbon nanotube composite structure 170 including a third surface and a fourth surface opposite to the third surface;

S72", forming the cathode electrode 15 on the third surface; and

S73", placing the preform structure 16 on the fourth surface, wherein the organic light emitting layer 14 is in direct contact with the fourth surface.

This method is similar to the method as shown in FIG. 20 above except that the carbon nanotube composite structure is different in the two methods. This method and the methods shown in FIGS. 16 and 20 have some advantages below. The parts of surface of the carbon nanotubes 118 are exposed from the polymer 120 before forming the cathode electrode 15 (or the organic light emitting layer 14). When the cathode electrode 15 (or the organic light emitting layer 14) is formed by sputtering, coating, vapor deposition, the exposed surface of the carbon nanotubes 118 are completely covered by the cathode electrode 15 (or the organic light emitting layer 14). Thus, the cathode electrode 15 (or the organic light emitting layer 14) has a large contact area with the carbon nanotubes 118, enhancing the ability of the carbon nanotubes 118 to transmit electrons.

Figure 25:
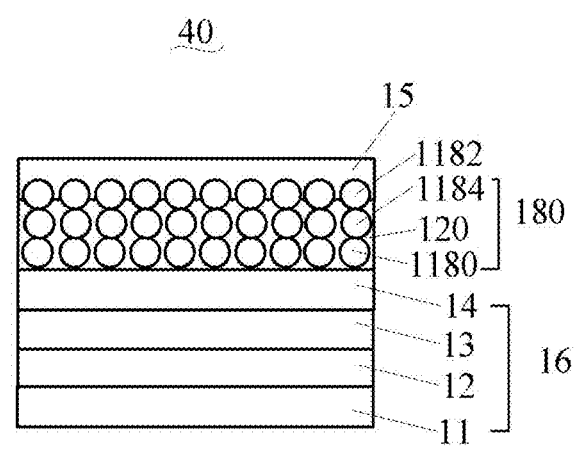
FIG. 25 is a schematic view of an eighth embodiment of an organic light emitting diode.

Referring to FIG. 25, an OLED 40 of an eighth embodiment is shown. The OLED 40 is similar to the OLED 30 above except that the carbon nanotube composite structure 180 is used as the electron transport layer of the OLED 40. The carbon nanotube composite structure 180 further includes a plurality of third carbon nanotubes 1184 dispersed in the polymer 120. Entire surface of the plurality of third carbon nanotubes 1184 is in direct contact with the polymer 120. The plurality of first carbon nanotubes 1180, the plurality of second carbon nanotubes 1182, and the plurality of third carbon nanotubes 1184 are in direct contact with each other in the thickness direction of the carbon nanotube composite structure 180. Thus, the electrons can be transferred from the cathode electrode 15 to the organic light emitting layer 14. Thus, the carbon nanotube composite structure 180 can be used as the electron transport layer for transporting electrons no matter the material of the polymer 120 can or cannot transmit electrons. Thus, the material of the polymer is not limited.

Figure 26:
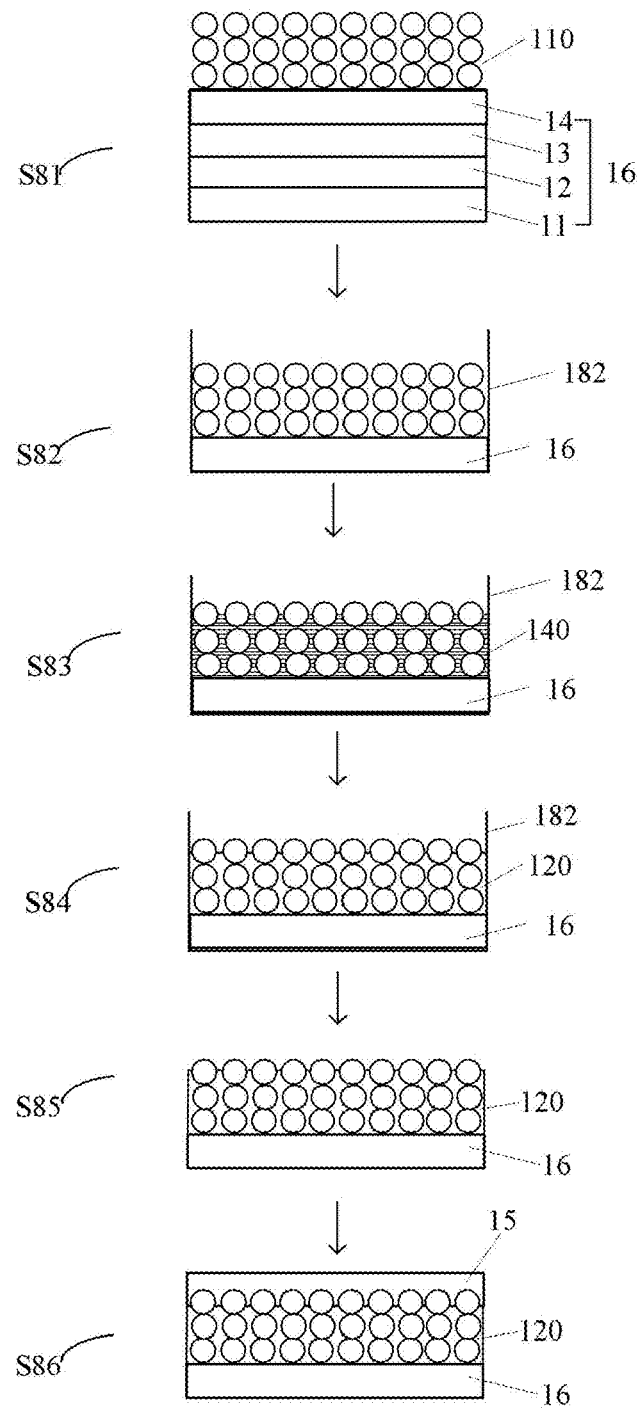
FIG. 26 is a schematic process flow of a method for making the organic light emitting diode of FIG. 25.

Referring to FIG. 26, a method for making the OLED 40 of the eighth embodiment includes the following steps:

S81, placing the carbon nanotube structure 110 on the preform structure 16, wherein the carbon nanotube structure 110 is in direct contact with the surface of the organic light emitting layer 14 away from the hole transport layer 13;

S82, placing the carbon nanotube structure 110 and the preform structure 16 into the container 182, wherein the container 182 has the opening;

S83, injecting the monomer solution 140 into the container 182 from the opening of the container 182, wherein the monomer solution 140 is formed by dispersing the monomer into the organic solvent;

S84, polymerizing the monomer to form the polymer 120;

S85, removing the container 182; and

S86, forming the cathode electrode 15 on the surface of the polymer 120 away from the preform structure 16.

The method for making the OLED 40 as shown in FIG. 26 is similar to the method for making the carbon nanotube composite structure 180 as shown in FIG. 12 above except that: 1) in FIG. 12, the carbon nanotube structure 110 is placed on the substrate 100; in FIG. 26, the carbon nanotube structure 110 is placed on the preform structure 16; 2) in FIG. 12, both the substrate 100 and the container 182 are removed; in FIG. 26, only the container 182 is removed, and the cathode electrode 15 is formed on the polymer 120.

Figure 27:
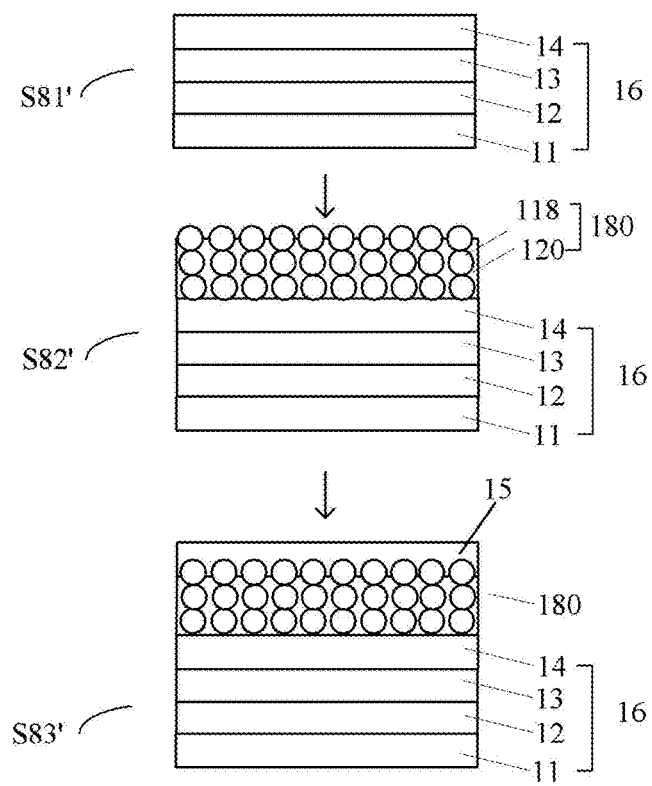
FIG. 27 is another schematic process flow of a method for making the organic light emitting diode of FIG. 25.

Referring to FIG. 27, another method for making the OLED 40 of the eighth embodiment includes the following steps:

S81', providing the preform structure 16 including the support body 11, the anode electrode 12, the hole transport layer 13, and the organic light emitting layer 14, wherein the support body 11, the anode electrode 12, the hole transport layer 13, and the organic light emitting layer 14 are stacked on each other in that order;

S82', placing the carbon nanotube composite structure 180 on the surface of the organic light emitting layer 14 away from the hole transport layer 13, wherein carbon nanotube composite structure 180 includes the plurality of first carbon nanotubes 1180, the plurality of second carbon nanotubes 1182, and the plurality of carbon nanotubes 1184; the part of the surface of each first carbon nanotube 1180 is exposed from the polymer 120 and in direct contact with the organic light emitting layer 14, and the part of the surface of each second carbon nanotube 1182 is exposed from the polymer 120; and entire surface of the plurality of carbon nanotubes is covered by the polymer 120; and S83', forming the cathode electrode 15 on the surface of the carbon nanotube composite structure 180 away from the organic light emitting layer 14, wherein the part of the surface of each second carbon nanotube 1182 is exposed from the polymer 120 and in direct contact with the cathode electrode 15.

The method as shown in FIG. 27 is similar to the method as shown in FIG. 19 above except that the carbon nanotube composite structure is different in the two methods.

Yet another method for making the OLED 40 of the eighth embodiment includes the following steps:

S81", providing the carbon nanotube composite structure 180;

S82", forming the cathode electrode 15 on the carbon nanotube composite structure 180; and S83", forming the preform structure 16 on the surface of the carbon nanotube composite structure 180 away from the cathode electrode 15, wherein the organic light emitting layer 14 is in direct contact with the carbon nanotube composite structure 180.

Figure 28:
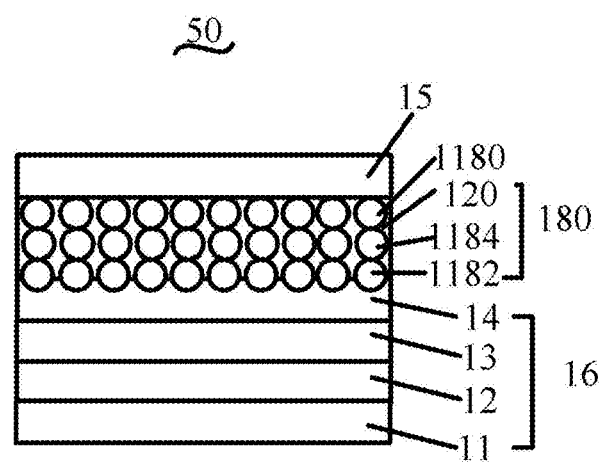
FIG. 28 is a schematic view of a ninth embodiment of an organic light emitting diode.

Referring to FIG. 28, an OLED 50 of a ninth embodiment is shown. The OLED 50 is similar to the OLED 40 above except that a part of the surface of each first carbon nanotube 1180 is exposed from the polymer 120 and in direct contact with the cathode electrode 15, a part of the surface of each second carbon nanotube 1182 is exposed from the polymer 120 and in direct contact with the organic light emitting layer 14, and each second carbon nanotube 1182 is embedded in the organic light emitting layer 14.

Figure 29:
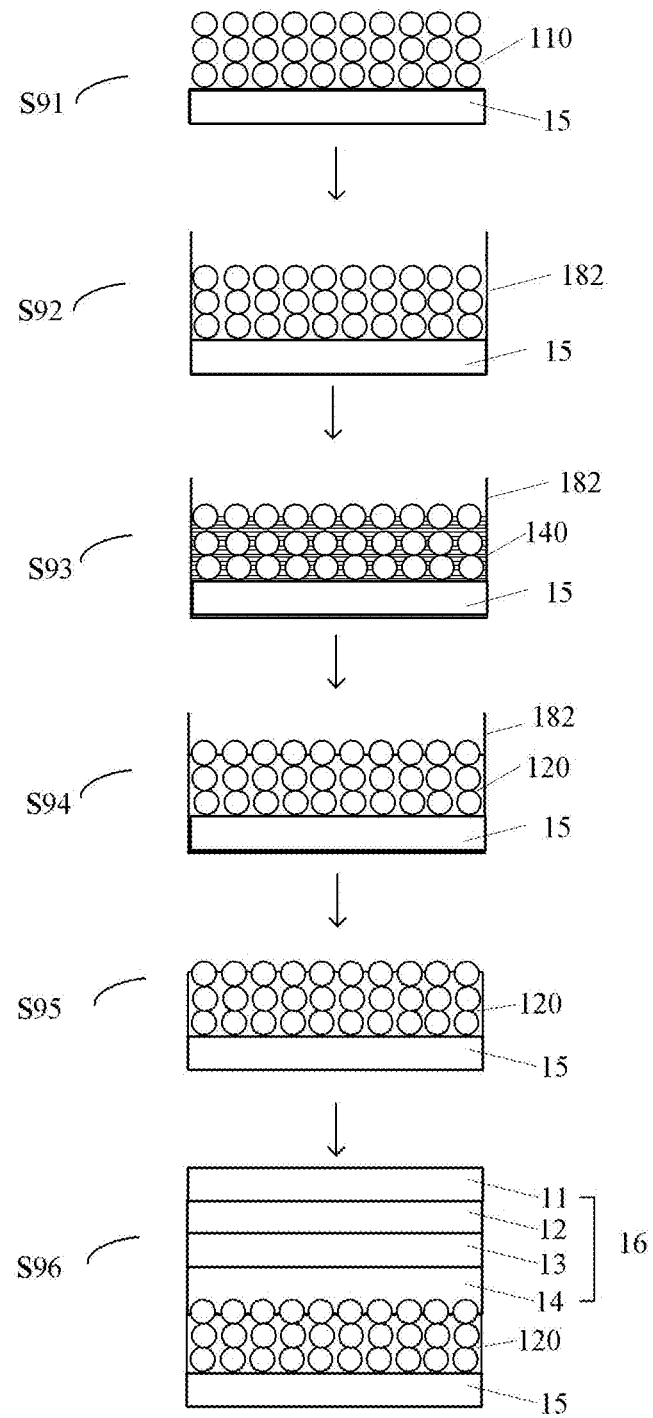
FIG. 29 is a schematic process flow of a method for making the organic light emitting diode of FIG. 28.

Referring to FIG. 29, a method for making the OLED 50 of the ninth embodiment includes the following steps:

S91, placing the carbon nanotube structure 110 on the cathode electrode 15;

S92, placing the carbon nanotube structure 110 and the cathode electrode 15 into the container 182, wherein the container 182 has the opening;

S93, injecting the monomer solution 140 into the container 182 from the opening of the container 182, wherein the monomer solution 140 is formed by dispersing the monomer into the organic solvent;

S94, polymerizing the monomer to form the polymer 120;

S95, removing the container 182; and

S96, placing the preform structure 16 on the surface of the polymer 120 away from the cathode electrode 15, wherein the organic light emitting layer 14 is in direct contact with the polymer 120.

The method for making the OLED 50 as shown in FIG. 29 is similar to the method for making the carbon nanotube composite structure 180 as shown in FIG. 12 above except that: 1) in FIG. 12, the carbon nanotube structure 110 is placed on the substrate 100; in FIG. 29, the carbon nanotube structure 110 is placed on the cathode electrode 15; 2) in FIG. 12, both the substrate 100 and the container 182 are removed; in FIG. 29, only the container 182 is removed, and the preform structure 16 is placed on the polymer 120. In this embodiment, the cathode electrode 15 is an aluminum plate.

The methods shown in FIGS. 14, 18, 23, 26, and 29 have some advantages below. The preform structure 16 or the cathode electrode 15 is used as a substrate for supporting the carbon nanotube structure 110. The monomer solution 140 is coated on the carbon nanotube structure 110, then the monomer of the monomer solution 140 is polymerized to form the electron transport layer, and then other functional layers are set. The monomer solution 140 has a low viscosity, thus the monomer solution 140 can be uniformly distributed in the carbon nanotube structure 110. After polymerizing the monomer, the carbon nanotubes 118 have good dispersion in the electron transport layer, thereby the transmitting electrons ability of the electron transport layer is improved.

Figure 30:
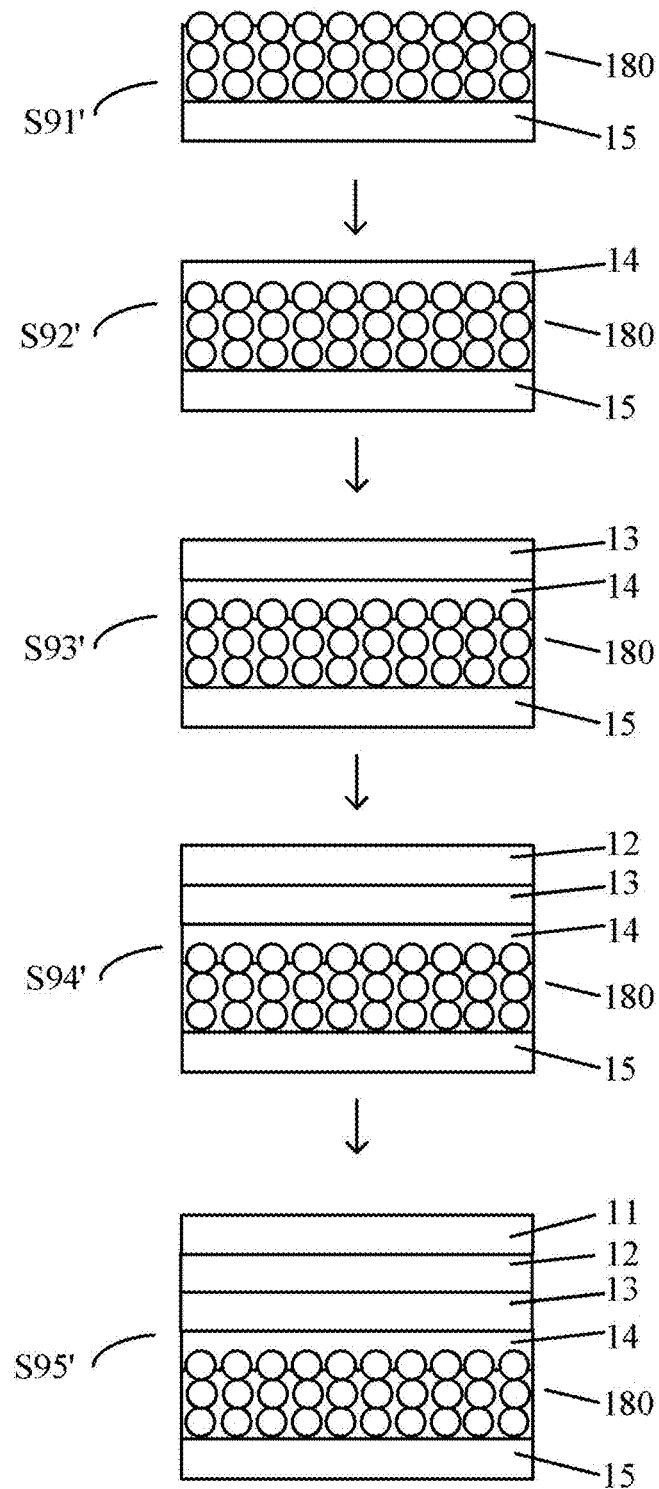
FIG. 30 is another schematic process flow of a method for making the organic light emitting diode of FIG. 28.

Referring to FIG. 30, another method for making the OLED 50 of the ninth embodiment includes the following steps:

S91', placing the carbon nanotube composite structure 180 on the cathode electrode 15, wherein in the carbon nanotube composite structure 180, the part of the surface of each first carbon nanotube 1180 is exposed from the polymer 120 and in direct contact with the cathode electrode 15, the part of the surface of each second carbon nanotube 1182 is exposed from the polymer 120, and entire surface of the plurality of carbon nanotubes is covered by the polymer 120;

S92', forming the organic light emitting layer 14 on the surface of the carbon nanotube composite structure 180 away from the cathode electrode 15; and S93', forming the hole transport layer 13 on the surface of the organic light emitting layer 14 away from the carbon nanotube composite structure 180;

S94', forming the anode electrode 12 on the surface of the hole transport layer 13 away from the organic light emitting layer 14; and S95', placing the support body 11 on the surface of the anode electrode 12 away from the hole transport layer 13.

In the step S91', the cathode electrode 15 can support other element, and the material of the cathode electrode 15 is not limited. In one embodiment, the cathode electrode 15 is the aluminum plate. In the steps S92' and S93', the organic light emitting layer 14, the hole transport layer 13, and the anode electrode 12 are formed by sputtering, coating, vapor deposition, mask etching, spraying, or inkjet printing. The step S95' can be omitted.

The methods shown in FIGS. 15, 19, 24, 27, and 30 have some advantages below. The support body 11, the anode electrode 12, the hole transport layer 13, the organic light emitting layer 14, and the carbon nanotube composite structure 130 (170 or 180) are successively laminated together. Then, the organic light emitting layer 14 and the carbon nanotube composite structure 130 (170 or 180) are tightly bonded by pressing. Finally, the cathode electrode 15 is formed on the surface of the carbon nanotube composite structure 130 (170 or 180) away from the organic light emitting layer 14. The carbon nanotubes 118 of the carbon nanotube composite structure 130 (170 or 180) are substantially parallel to each other and extend the same direction. The relatively regular arrangement of the carbon nanotubes 118 can improve the transmitting electrons ability of the electron transport layer.

Figure 31:
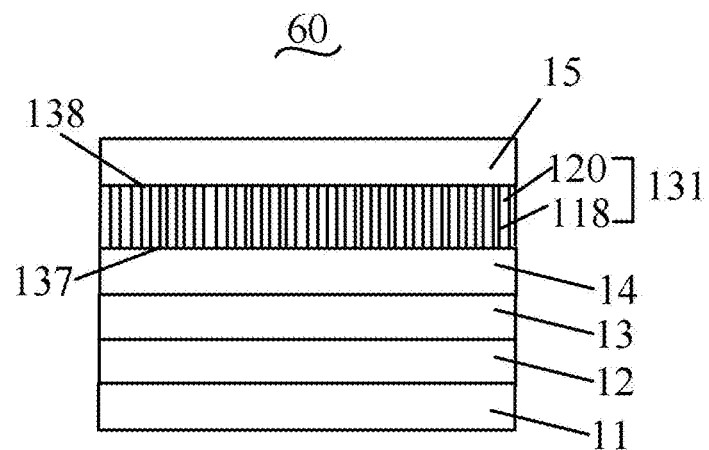
FIG. 31 is a schematic view of a tenth embodiment of an organic light emitting diode.

Referring to FIG. 31, an OLED 60 of a tenth embodiment is shown. The OLED 60 is similar to the OLED 10. The difference between the OLED 10 and the OLED 60 is that the electron transport layer of the OLED 10 is the carbon nanotube composite structure 130, however the electron transport layer of the OLED 60 is a carbon nanotube composite sub-structure 131 which is formed by treating the carbon nanotube composite structure 130.

In the OLED 60, the carbon nanotube composite sub-structure 131 includes the polymer 120 and a plurality of carbon nanotubes 118 dispersed in the polymer 120. The length direction of the plurality of carbon nanotubes 118 is from the organic light emitting layer 14 to the cathode electrode 15. In OLED 60, each carbon nanotube 118 has a first end and a second end opposite to the first end, the first end is exposed from the polymer 120 and in direct contact with the organic light emitting layer 14, and the second end is exposed from the polymer 120 and in direct contact with the cathode electrode 15. The plurality of carbon nanotubes 118 are parallel to each other. The material of the polymer 120 in the carbon nanotube composite sub-structure 131 is not limited. The carbon nanotube composite sub-structure 131 has a first sub-structure surface 137 that is in direct contact with the organic light emitting layer 14. The length direction of the plurality of carbon nanotubes 118 and the sub-structure surface form an angle, and the angle is grater than 0 degrees and less than or equal to 90 degrees. In one embodiment, the length direction of the plurality of carbon nanotubes 118 is perpendicular to the sub-structure surface.

Figure 33:
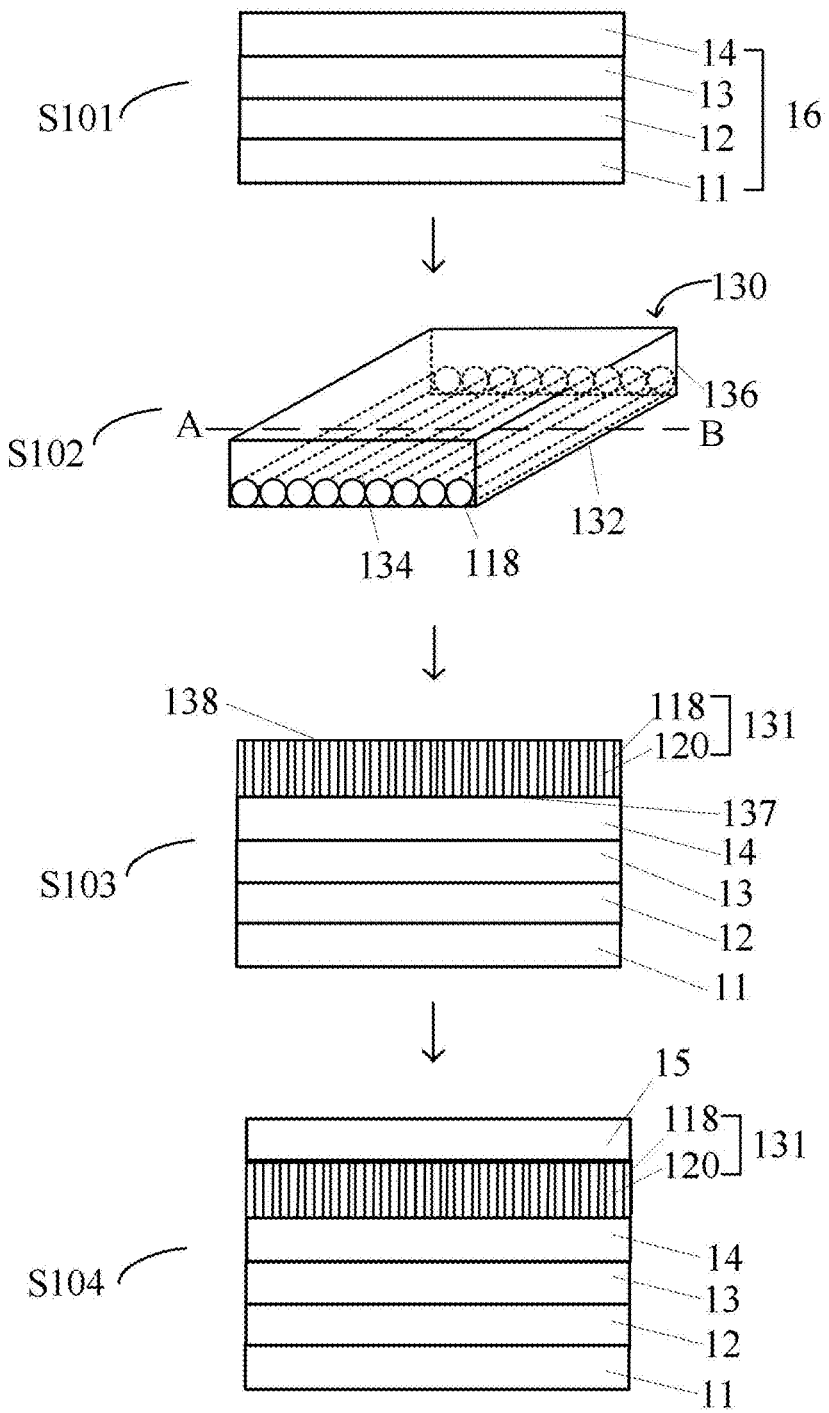
FIG. 33 is a schematic process flow of a method for making the organic light emitting diode of FIG. 31.

Referring to FIG. 33, a method for making the OLED 60 of the tenth embodiment includes the following steps:

S101, providing the preform structure 16 including the support body 11, the anode electrode 12, the hole transport layer 13, and the organic light emitting layer 14, wherein the support body 11, the anode electrode 12, the hole transport layer 13, and the organic light emitting layer 14 are stacked on each other in that order;

S102, treating the carbon nanotube composite structure 130 to form the carbon nanotube composite sub-structure 131 having the sub-structure surface and the plurality of carbon nanotubes 118, wherein the length direction of the plurality of carbon nanotubes 118 is parallel to the thickness direction of the carbon nanotube composite sub-structure 131;

S103, placing the carbon nanotube composite sub-structure 131 on the preform structure 16, wherein the carbon nanotube composite sub-structure 131 is in direct contact with the organic light emitting layer 14; and S104, forming the cathode electrode 15 on the surface of the carbon nanotube composite sub-structure 131 away from the preform structure 16.

The step S102 can be performed before the step S101.

In the step 102, the thickness of the carbon nanotube composite structure 130 in this embodiment is greater than the thickness of the carbon nanotube composite structure 130 in the first embodiment. The amount of the monomer solution 140 can be increased so that the thickness of the polymer 120 becomes large, thus the thickness of the carbon nanotube composite structure 130 becomes large.

Figure 32:
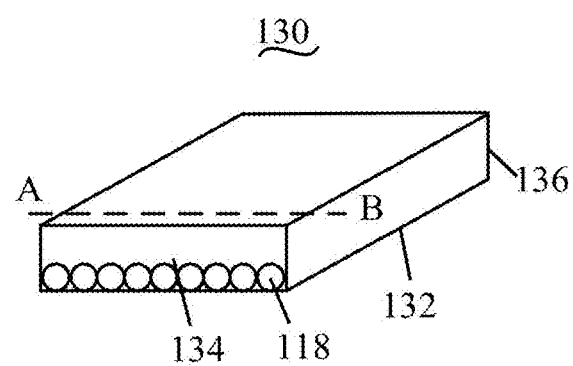
FIG. 32 is a schematic process flow of a method for making the tenth embodiment of treating the carbon nanotube composite structure.
Figure 32:
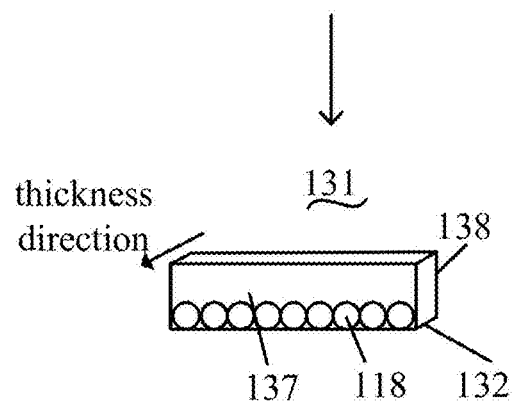

The carbon nanotube composite structure 130 is treated by slicing. The carbon nanotube composite structure 130 is cut by laser along a direction perpendicular to the first composite structure surface 132, as shown in FIG. 32. The carbon nanotube composite structure 130 has a third composite structure surface 134 and a fourth composite structure surface 136 opposite to the third composite structure surface 134. In one embodiment, the third composite structure surface 134 and the fourth composite structure surface 136 are perpendicular to the first composite structure surface 132. When the carbon nanotube composite structure 130 is cut, a cut line AB is formed on the carbon nanotube composite structure 130. The cut line AB can be perpendicular to the length direction of the carbon nanotubes 118 and parallel to the third composite structure surface 134. The distance between the cut line AB and the third composite structure surface 134 can be adjusted, and the carbon nanotube composite sub-structure 131 is formed after cutting along the cut line AB. The carbon nanotube composite sub-structure 131 is a sheet or a film. The carbon nanotube composite sub-structure 131 has the first sub-structure surface 137 and a second sub-structure surface 138 opposite to the first sub-structure surface 137. The first sub-structure surface 137 is parallel to the third composite structure surface 134, and the second sub-structure surface 138 is parallel to the fourth composite structure surface 136. In one embodiment, the length direction of each carbon nanotube 118 is perpendicular to the third composite structure surface 134.

The carbon nanotube composite sub-structure 131 can conduct and transport electrons, so the cathode electrode 15 can be omitted, and the step S104 can be omitted.

Figure 34:
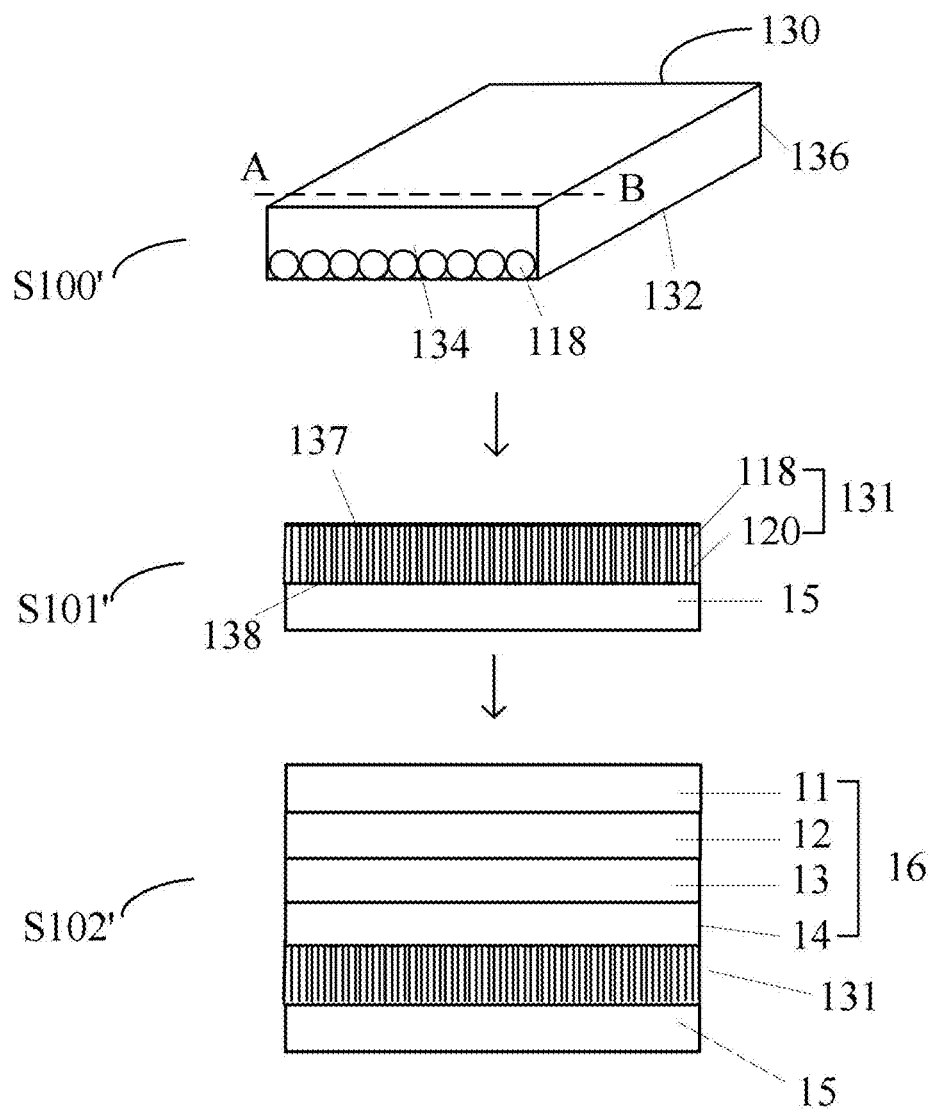
FIG. 34 is another schematic process flow of a method for making the organic light emitting diode of FIG. 31.

Referring to FIG. 34, another method for making the OLED 60 of the tenth embodiment includes the following steps:

S101', treating the carbon nanotube composite structure 130 to form the carbon nanotube composite sub-structure 131 having the first sub-structure surface 137, the second sub-structure surface 138 and the plurality of carbon nanotubes 118, wherein the length direction of the plurality of carbon nanotubes 118 is parallel to the thickness direction of the carbon nanotube composite sub-structure 131;

S102', placing the carbon nanotube composite sub-structure 131 on the cathode electrode 15, and the second sub-structure surface 138 is in direct contact with the cathode electrode 15;

S103', placing the preform structure 16 on the first sub-structure surface 137, wherein the carbon nanotube composite sub-structure 131 is in direct contact with the organic light emitting layer 14.

The OLED 60 shown in FIG. 31 and the methods shown in FIG. 33 and FIG. 34 have some advantages below. The electrical conductivity of the carbon nanotube 118 along the longitudinal direction (axial direction) is good, and the electrical conductivity of the carbon nanotube 118 along the radial direction is poor. The length direction of the plurality of carbon nanotubes 118 is from the organic light emitting layer 14 to the cathode electrode 15, thus transmitting electrons ability of the electron transport layer is improved. In addition, both the polymer having transmitting electrons ability and the polymer without transmitting electrons can be materials of the polymer 120.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may comprise some indication in reference to certain steps. However, the indication used is only to be viewed for identification purposes and not as a suggestion as to an order for the steps.

What is claimed is:

1. An organic light emitting diode, comprising:
a support body, an anode electrode, a hole transport layer, an organic light emitting layer, and an electron transport layer stacked on each other in that order;
wherein the electron transport layer comprises a polymer and a plurality of first carbon nanotubes dispersed in the polymer, the polymer has a first surface and a second surface opposite to the first surface, partial surface of the plurality of first carbon nanotubes is exposed from the first surface and spaced apart from the organic light emitting layer, and the plurality of first carbon nanotubes is joined end-to-end by van der Waals attractive force and substantially extends along the same direction.

2. The organic light emitting diode of claim 1, wherein a length direction of the plurality of first carbon nanotubes is parallel to a surface of the organic light emitting layer.

3. The organic light emitting diode of claim 1, wherein the electron transport layer further comprises a plurality of second carbon nanotubes dispersed in the polymer, and partial surface of the plurality of second carbon nanotubes is exposed from the second surface and in direct contact with the organic light emitting layer.

4. The organic light emitting diode of claim 3, wherein the plurality of second carbon nanotubes is joined end-to-end by van der Waals attractive force and substantially extends along the same direction.

5. The organic light emitting diode of claim 3, wherein the plurality of first carbon nanotubes and the plurality of second carbon nanotubes are spaced apart from each other.

6. The organic light emitting diode of claim 3, wherein the electron transport layer further comprises a plurality of third carbon nanotubes dispersed in the polymer, and the plurality of first carbon nanotubes and the plurality of second carbon nanotubes are electrically connected to each other by the plurality of third carbon nanotubes.

7. The organic light emitting diode of claim 6, wherein the plurality of first carbon nanotubes, the plurality of second carbon nanotubes, and the plurality of third carbon nanotubes are parallel to each other.

8. The organic light emitting diode of claim 1, further comprises a cathode electrode located on the first surface and being in direct contact with the plurality of first carbon nanotubes.

9. The organic light emitting diode of claim 8, further comprising an electron injection layer located between the electron transport layer and the cathode electrode.

10. The organic light emitting diode of claim 1, further comprising a hole injection layer located between the anode electrode and the hole transport layer.

11. The organic light emitting diode of claim 1, wherein the electron transport layer is also used as a cathode electrode.

12. The organic light emitting diode of claim 1, wherein the polymer is an aromatic compound.

13. The organic light emitting diode of claim 12, wherein the polymer is 8-Hydroxyquinoline aluminum salt (AlQ), 2-(4-tert(4-biphenyl)-1,3,4-oxadiazole (PBD), or $Beq_2$ or 4,4'-Bis(2,2-diphenylvinyl)-1,1'-biphenyl (DPVBi).

14. An organic light emitting diode, comprising:
a support body, an anode electrode, a hole transport layer, an organic light emitting layer, an electron transport layer, and a cathode electrode stacked on each other in that order;
wherein the electron transport layer comprises a polymer and a plurality of first carbon nanotubes dispersed in the polymer, the polymer has a first surface and a second surface opposite to the first surface, partial surface of the plurality of first carbon nanotubes is exposed from the first surface and spaced apart from the organic light emitting layer, and length directions of the plurality of first carbon nanotubes are substantially parallel to each other.

15. The organic light emitting diode of claim 14, wherein the polymer is an aromatic compound.

16. The organic light emitting diode of claim 14, wherein a height difference between a highest position of the first surface and a lowest position of the first surface is greater than or equal to 0 nanometers and less than or equal to 30 nanometers.

17. The organic light emitting diode of claim 14, wherein the electron transport layer further comprises a plurality of second carbon nanotubes dispersed in the polymer, and the plurality of first carbon nanotubes and the plurality of second carbon nanotubes are spaced apart from each other.

18. The organic light emitting diode of claim 17, wherein the electron transport layer further comprises a plurality of third carbon nanotubes dispersed in the polymer, and the plurality of first carbon nanotubes and the plurality of second carbon nanotubes are electrically connected to each other by the plurality of third carbon nanotubes.

* * * * *